(12) United States Patent
Watanabe

(10) Patent No.: US 6,486,802 B2
(45) Date of Patent: Nov. 26, 2002

(54) LOW POWER CONSUMPTION ENCODER, CONTROL METHOD THEREFOR AND COORDINATE INPUT DEVICE USING THE SAME

(75) Inventor: Kazuhiro Watanabe, Tokyo (JP)

(73) Assignee: Fujitsu Takamisawa Component Limited, Tokyo (JP)

( * ) Notice: Subject to any disclaimer, the term of this patent is extended or adjusted under 35 U.S.C. 154(b) by 0 days.

(21) Appl. No.: 09/768,230

(22) Filed: Jan. 25, 2001

(65) Prior Publication Data

US 2001/0028316 A1 Oct. 11, 2001

(30) Foreign Application Priority Data

Apr. 11, 2000 (JP) ........................................ 2000-115808

(51) Int. Cl.[7] ................................................ H03M 1/22
(52) U.S. Cl. ...................................... 341/13; 250/231.8
(58) Field of Search ............................ 341/13; 307/463, 307/455, 456; 250/231.8, 231.13, 231.17, 23.18

(56) References Cited

U.S. PATENT DOCUMENTS

| 4,705,943 | A | * | 11/1987 | Charlton | 250/231 |
|---|---|---|---|---|---|
| 4,725,723 | A | * | 2/1988 | Shimojima | 250/205 |
| 4,833,316 | A | * | 5/1989 | Yoneda | 250/231 |
| 5,306,966 | A | * | 4/1994 | Ohkawa | 307/463 |
| 5,495,358 | A | * | 2/1996 | Bartig et al. | 359/189 |
| 6,184,518 | B1 | * | 2/2001 | Klein | 250/231.8 |

FOREIGN PATENT DOCUMENTS

| JP | 04-358465 | * 12/1992 |
|---|---|---|
| JP | 6-95798 | 4/1994 |
| JP | 7-35614 | 2/1995 |

* cited by examiner

Primary Examiner—Peguy JeanPierre
Assistant Examiner—Joseph J Lauture
(74) Attorney, Agent, or Firm—Staas & Halsey LLP

(57) ABSTRACT

An encoder having a light emitting device and a photo IC for receiving light emitted from the light emitting device. The encoder includes a driving unit having a first driving power output terminal, to which one of a pair of power supply terminals of the photo IC is connected, for outputting driving power. The driving power is used for intermittently driving the photo IC only for a desired time period.

19 Claims, 19 Drawing Sheets

DIRECTION OF ROTATION OF DISK
(COUNTERCLOCKWISE WHEN VIEWED FROM PHOTO IC SIDE)

Fig. 19

| | ORDINARY MODE | SUSPENDED MODE | FIGURES ILLUSTRATING PRINCIPLE & CONSTITUTION |
|---|---|---|---|
| LIGHT EMITTING DEVICE<br>PHOTO IC | CONTINUOUSLY DRIVEN<br>CONTINUOUSLY DRIVEN | CONTINUOUSLY DRIVEN<br>INTERMITTENTLY DRIVEN | Fig.1, 2, 6, 10 |
| LIGHT EMITTING DEVICE<br>PHOTO IC | CONTINUOUSLY DRIVEN<br>CONTINUOUSLY DRIVEN | CONTINUOUSLY DRIVEN<br>OFF | Fig.1, 2, 6, 10 |
| LIGHT EMITTING DEVICE<br>PHOTO IC | INTERMITTENTLY DRIVEN<br>INTERMITTENTLY DRIVEN | INTERMITTENTLY DRIVEN<br>INTERMITTENTLY DRIVEN | Fig.4, 6, 9, 10 |
| LIGHT EMITTING DEVICE<br>PHOTO IC | INTERMITTENTLY DRIVEN<br>CONTINUOUSLY DRIVEN | INTERMITTENTLY DRIVEN<br>INTERMITTENTLY DRIVEN | Fig.6, 10 |
| LIGHT EMITTING DEVICE<br>PHOTO IC | CONTINUOUSLY DRIVEN<br>CONTINUOUSLY DRIVEN | INTERMITTENTLY DRIVEN<br>INTERMITTENTLY DRIVEN | Fig.4, 6, 9, 10 |
| LIGHT EMITTING DEVICE<br>PHOTO IC | INTERMITTENTLY DRIVEN<br>CONTINUOUSLY DRIVEN | OFF<br>OFF | Fig.6, 10 |
| LIGHT EMITTING DEVICE<br>PHOTO IC | CONTINUOUSLY DRIVEN<br>CONTINUOUSLY DRIVEN | OFF<br>OFF | Fig.4, 6, 9, 10 |

LOW POWER CONSUMPTION ENCODER, CONTROL METHOD THEREFOR AND COORDINATE INPUT DEVICE USING THE SAME

BACKGROUND OF THE INVENTION

1. Field of the Invention

The present invention relates to an optical rotary encoder, a control method therefor, and a coordinate input device using the optical rotary encoder.

2. Description of the Related Art

In recent years, GUIs (Graphical User Interfaces) have been employed so as to enhance the operability of PCs (Personal Computers). Coordinate input devices, such as mice and track balls, have been used to as to point at icons indicated on the screens of display units.

In such a coordinate input device, an optical rotary encoder is frequently used so as to resolve each of the amount and direction of rotation of a ball contained therein into orthogonal components respectively corresponding to two directions, that is, the X-direction and the Y-direction, and so as to measure the orthogonal components.

Generally, the optical rotary encoder has light emitting devices or elements, light receiving devices for receiving light emitted from the light emitting devices, and a slitted disk. The disk is disposed between the light emitting devices and the light receiving devices. When the disk rotates, the slits of the disk transmit the light emitted from the light emitting devices. Conversely, the remaining non-transparent parts of the disk interrupt the light emitted from the light emitting devices. The light receiving devices receive the light transmitted through the slits. The received light is converted into electric pulse signals corresponding to the speed and direction of rotation of the disk.

The coordinate input device using the optical rotary encoder detects the amount and direction of movement of the operated ball as the amount and direction of rotation of the disk of the optical rotary encoder.

Generally, a set of light emitting diodes (LEDs) and phototransistors is used as a set of the light emitting devices and the light receiving devices of the optical rotary encoder. The phototransistor is a device containing a photodiode and a transistor, and has a light or optical amplification function of amplifying a signal, which is obtained by a photoelectric conversion in the photodiode, by the transistor.

LEDs and transistors are analog devices, so that there is an individual difference in characteristic among the LEDs or the transistors. That is, there is an individual difference in, for example, luminous intensity among LEDs. Further, there is an individual difference in, for instance, light receiving sensitivity among phototransistors. When such an individual difference is large, the extraction of information on the amount and direction of rotation of the disk of the optical rotary encoder is difficult owing to a subtle change in temperature and to deterioration with time of devices. Especially, in the case of using an optical rotary encoder in the coordinate input device, a mouse cursor cannot move normally.

Therefore, generally, when an optical rotary encoder using LEDs and phototransistors is designed, a desired magnitude of the optical coupling between the LEDs and the phototransistors is obtained by adjusting the constants of the devices of various kinds of processing circuits and adjusting the distance between the LEDs and the phototransistors so as to eliminate the individual difference among the devices. Consequently, stable outputs of the optical rotary encoder are secured.

Moreover, generally, LEDs and phototransistors are classified into what are called "ranks" based on the aforementioned individual differences. For example, LEDs are classified into ranks according to relative levels (or luminosity rank) of a luminous amount. On the other hand, phototransistors are classified into ranks according to relative levels (or reception light intensity ranks) of a photocurrent flowing therethrough when light of the same amount is irradiated thereon. When an optical rotary encoder is designed, the ranks of such devices are sufficiently taken into consideration. An optimal combination of LEDs and phototransistors, which ensures a stable operation of the optical rotary encoder, is selected.

The aforementioned circuit adjustment and the adjustment of the distance between LEDS and phototransistors at the time of fabricating an optical rotary encoder are costly and unreliable. Furthermore, when an optical rotary encoder is designed by considering the luminous ranks and the reception light intensity ranks, the range of choices of available devices is narrow. Consequently, the fabrication costs of the optical rotary encoder are high.

Besides, in the case of using, for example, the aforementioned optical rotary encoder as the coordinate input device, it is possible to input an output of the phototransistor directly to a microcomputer serving as a coordinate processing unit in the coordinate input device. However, the outputs of the phototransistors need adjustment because of the fact that the threshold voltage of the input port of the microcomputer changes according to the specification thereof.

In recent years, devices called photo ICs have been supplied to the market as light receiving devices obtained by improving the phototransistors that have such defects. Optical rotary encoders employing photo ICs as the light receiving devices are currently on the market.

An ordinary phototransistor has two photodiodes, while a photo IC has four photodiodes and hundreds of transistors. In a photo IC, two pairs of photodiodes are used and adapted so that each pair of photodiodes generates two signals, whose phases are inverted, from received light, that a differential signal representing the difference between the two signals is then obtained, and that an electric pulse signal is outputted by shaping the waveform of the differential signal into a rectangular waveform.

Therefore, photo ICs have an advantage in resistance to change in temperature and humidity and to variation in amount of a luminosity (that is, to deterioration with time of an amount of a luminosity) over ordinary phototransistors having only the optical amplification function.

Moreover, because output signals of a photo IC are electric rectangular pulse signals, namely, binary signals each having a high level or a low level, photo ICs have another advantage in that output signals of a photo IC can be inputted directly to a microcomputer of a coordinate input device when the photo IC is used in, for instance, an optical rotary encoder of the coordinate input device.

Photo ICs are integrated circuits, and have another advantage in that each photo IC can have various additional functions in addition to a light receiving function. For example, in the case that LEDs serving as light emitting devices are intermittently driven, and that light emitted by the LEDs is received by a photo IC, the photo IC can have a data holding function by which data obtained by the photo IC at the time of receiving light is stored in an internal memory even when the LEDs are turned off.

Thus, a device using photo ICs in an optical rotary encoder has many advantages over a device using phototransistors in an optical rotary encoder. However, the former device has many drawbacks.

First, the former device using the photo ICs has a drawback in that the photo IC is an integrated circuit and always consumes electric current even in the case of receiving no light, different from the latter device in which ordinary phototransistors fundamentally output no electric current when receiving no light.

Although the photo IC always consumes electric current, the value of the electric current varies from hundreds $\mu$m to several mA and thus the photo IC does not impede an operation of a coordinate input device having an interface, such as a PS/2 (Personal System/2) interface, in the case that the photo IC is used in such a coordinate input device. However, in the case of the device using a USB (Universal Serial Bus) interface that has been becoming widespread in recent years, generally, electric current consumption in a suspended mode of a coordinate input device is prescribed by standards. The suspended mode is also referred to as a standby mode. In such a mode, for example, performance of a normally available function is temporarily paused, or such a function is tentatively disabled. Thus, the power consumption of the device is reduced in comparison with that in an ordinary operation mode of the device. Consequently, power saving is achieved. Incidentally, although the term "a sleep mode" is used in a similar sense, it is understood by those skilled in the art that the power consumption in the suspended mode is much lower than the power consumption in the sleep mode.

The standards prescribe that electric current consumed in the suspended mode of a peripheral device, such as a coordinate input device using a USB interface, should be less than 500 $\mu$A. However, the electric current consumed per photo IC is 200 $\mu$A at most. Further, an electric current of about 250 $\mu$A is consumed only by communication lines. Thus, the total consumption of electric current of the coordinate input device using two photo ICs is 650 $\mu$A, which exceeds the value prescribed by the standards.

Although the coordinate input device using photo ICs as the light receiving elements of the optical rotary encoder thereof has many advantages over the conventional device using phototransistors, especially, a reduction in electric current consumed in the suspended mode of the device is still an outstanding problem.

Accordingly, in view of the aforementioned problem, a first object of the present invention is to provide a low power consumption optical rotary encoder employing photo ICs as light emitting devices.

In view of the foregoing problem, a second object of the present invention is to provide a coordinate input device having a low power consumption optical rotary encoder that employs photo ICs as light emitting devices.

In view of the aforementioned problem, a third object of the present invention is to provide a control method of controlling a low power consumption optical rotary encoder that employs photo ICs as light emitting devices.

SUMMARY OF THE INVENTION

To achieve the first object of the present invention, according to a first aspect of the present invention, there is provided an encoder having a light emitting device and a photo IC for receiving light emitted from the light emitting device. This encoder comprises driving unit having a first driving power output terminal, to which one of a pair of power supply terminals of the photo IC is connected, for outputting driving power to be used for intermittently driving the photo IC only for a desired time period.

To achieve the second object of the present invention, according to a second aspect of the present invention, there is provided a coordinate input device that comprises the encoder according to the first aspect of the present invention and a slitted disk in which a plurality of slits are formed along a circumference at uniform intervals. This coordinate input device generates coordinate input data, which is to be inputted to a computer, according to slitted-disk rotation information.

To achieve the third object of the present invention, according to a third aspect of the present invention, there is provided a control method of controlling an encoder that comprises a light emitting device and a photo IC for receiving light from the light emitting device. According to this control method, electric power for intermittently driving the photo IC for a desired time period is outputted from a first driving power output terminal to which one of a pair of power supply terminals of the photo IC is connected.

In the case of the optical rotary encoder employing the photo IC as the light emitting device according to the first aspect of the present invention, the power consumption of the encoder can be reduced by intermittently supplying electric power to the photo IC as driving power therefor. Further, the power consumption can be reduced still more by intermittently driving the light emitting device of the encoder.

In the case of the coordinate input device according to the second aspect of the present invention, the encoder enabled to intermittently supply electric power to the photo IC as the driving power supply therefor is used for detecting the amount and direction of movement of the coordinate input device. The power consumption of the coordinate input device can be reduced.

In the case of the control method of controlling the optical rotary encoder, which employs the photo IC as the light receiving device, according to the third aspect of the present invention, electric power can intermittently be supplied to the photo IC as a driving power supply therefor. Further, the light emitting device of the encoder can intermittently be driven. The power consumption can be reduced still more.

BRIEF DESCRIPTION OF THE DRAWINGS

Other features, objects and advantages of the present invention will become apparent from the following description of preferred embodiments with reference to the drawings in which like reference characters designate like or corresponding parts throughout several view in which:

FIG. 19 is a table describing the combinations of the driven states of a light emitting device and a photo IC in an ordinary mode and a suspended mode of an encoder used in the coordinate input device, which is the seventh embodiment of the present invention, and the figure numbers of the figures each illustrating the principle and constitution of the corresponding encoder implementing the corresponding combination.

DETAILED DESCRIPTION OF THE PREFERRED EMBODIMENTS

An encoder of the present invention has a light emitting device, a photo IC for receiving light emitted from the light emitting device, and a driving unit having a first driving power output terminal, to which one of a pair of power supply terminals of the photo IC is connected, for outputting driving power to be used for intermittently driving the photo IC only for a desired time period. The power consumption of the photo IC is reduced by intermittently driving the photo IC.

Figure 1:
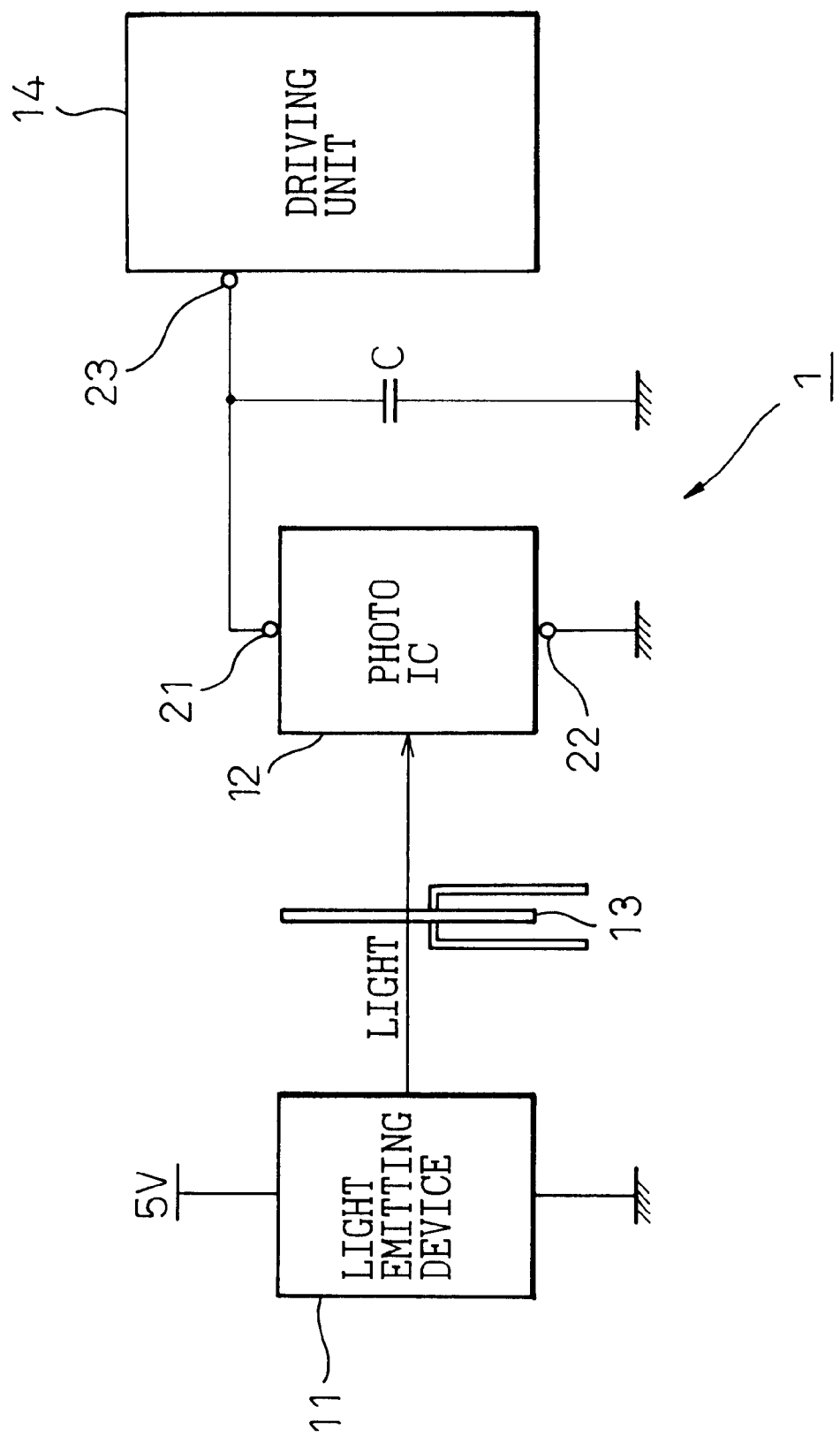
FIG. 1 is a diagram illustrating the principle and constitution of an encoder that is a first embodiment of the present invention.

FIG. 1 is a diagram illustrating an encoder that is a first embodiment of the present invention.

The encoder of this embodiment has a light emitting device 11, a photo IC 12, a slitted disk 13 in which slits (not shown) are formed, and a driving unit 14.

The light emitting device 11 of this embodiment is an LED. However, other kinds of light emitting devices may be employed as the device 11.

The photo IC 12 has a driving power input terminal 21 and a grounding terminal 22 as a pair of power supply terminals. The driving power input terminal 21 is connected to a first driving power output terminal 23 of the driving unit 14 (to be described later), while the grounding terminal 22 is grounded. The photo IC 12 contains four photodiodes (not shown) and hundreds of transistors (not shown), and is driven when a voltage of 5 volts (V) is applied to the driving power input terminal 21 and a voltage of 0 V is applied to the grounding terminal 22.

The slitted disk 13 is disposed between the light emitting device 11 and the photo IC 12. When the slitted disk 13 rotates while the light emitting device 11 emits light, the slits of the disk 13 transmit light emitted from the light emitting device 11. The remaining non-transparent portions of the disk 13 interrupt the light emitted from the device 11. Then, the photo IC 12 receives the light transmitted by the slits.

The driving unit 14 supplies driving power for driving the photo IC 12. The driving unit 14 has the first driving power output terminal 23, from which a voltage for driving the photo IC 12 is outputted. The first driving power output terminal 23 is connected to the driving power input terminal 21 of the photo IC 12. When the outputted voltage signal is a pulse-like signal, the photo IC 12 is intermittently driven. According to this embodiment, a signal representing a voltage of 5 V and a signal representing a voltage of 0 V are alternately outputted from the first driving power output terminal 23 as pulse voltage signals.

The photo IC 12 is grounded at the grounding terminal 22, so that the photo IC 12 operates when a voltage of 5 V is applied to the driving input terminal 21. That is, when the voltage outputted from the first driving power output terminal 23 is 5 V, the photo IC 12 operates. Conversely, when the voltage outputted therefrom is 0 V, the photo IC 12 stops operating. Therefore, the photo IC can intermittently be driven by causing the driving unit 14 to output the pulse voltage.

The driving unit 14 can be implemented by, for instance, a microcomputer, and may be programmed with data representing a pulse period and a duty ratio. Further, an ordinary pulse oscillator may be used instead of the microcomputer.

Incidentally, as will be described later, a bypass capacitor C may be connected in parallel with the photo IC 12 by being inserted between a pair of power supply terminals (namely, the driving power input terminal 21 and the grounding terminal 22 shown in FIG. 1) of the photo IC 12.

Further, as will be described later, in the case when the encoder 1 of this embodiment is used for detecting the rotation of a ball of the coordinate input device, it is preferable that the microcomputer, which is contained in the coordinate input device, for computing coordinates is adapted to have the function of the driving unit 14 of this embodiment of the present invention. At that time, one of the free output ports of the microcomputer may be allotted to the first driving power output terminal 23.

Figure 2:
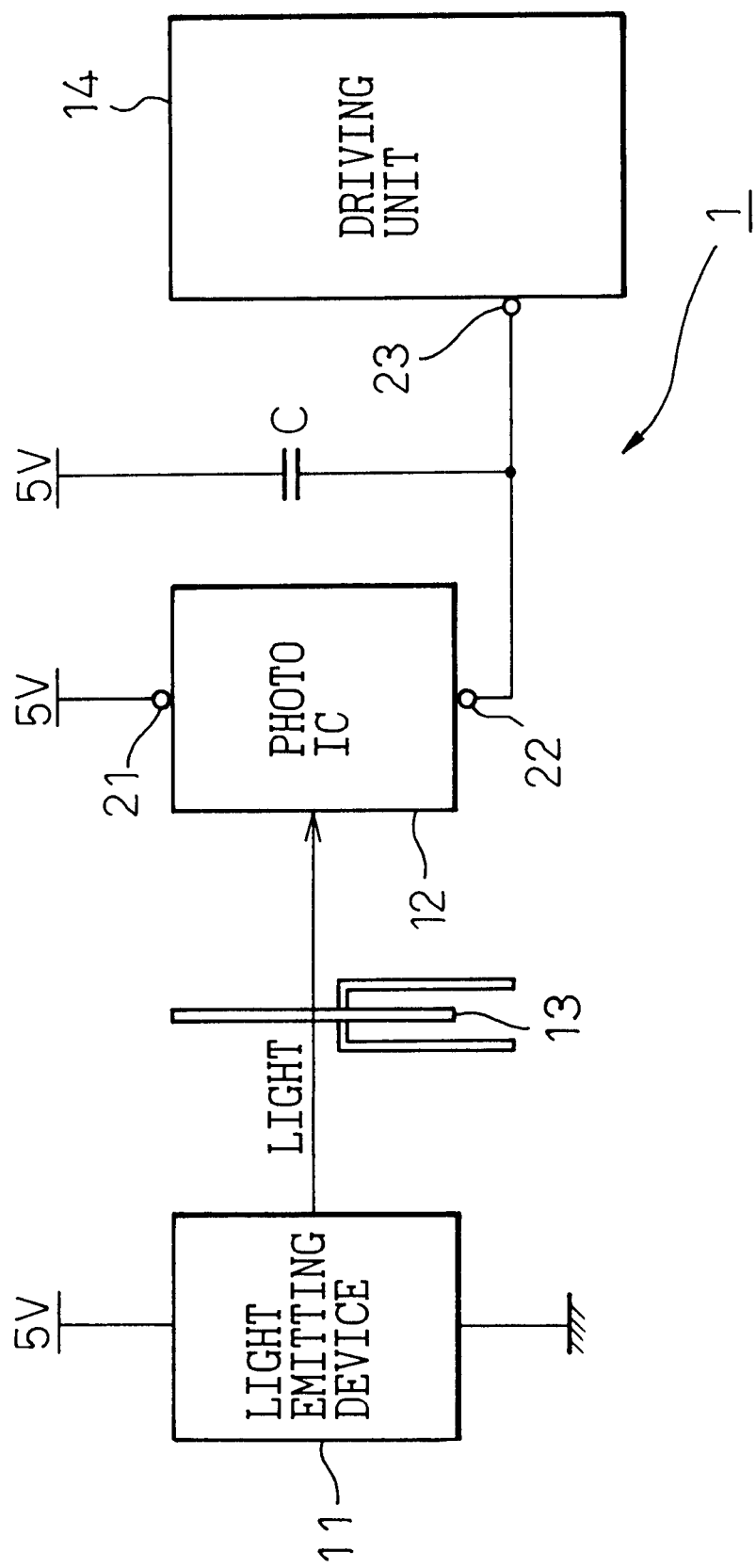
FIG. 2 is a diagram illustrating the principle and constitution of another encoder that is a second embodiment of the present invention.

FIG. 2 is a diagram illustrating the principle and constitution of a second embodiment of the present invention.

The encoder 1 of this embodiment comprises constituent elements similar to those of the encoder of the first embodiment. However, in the second embodiment a voltage of 5V is always applied to the driving power input terminal 21 of the photo IC 12, and the grounding terminal 22 is connected to the first driving power output terminal 23 of the driving unit 14. The rest of the second embodiment is similar to the first embodiment.

As described above, the photo IC 12 operates when a voltage of 5 V is applied to the driving power input terminal 21 and a voltage of 0 V is applied to the grounding terminal 22. However, because a voltage of 5 V is always applied to the driving power input terminal 21 of the second embodiment, the setting of the voltage level of the grounding terminal at 0 V can cause the photo IC 12 to operate.

The driving unit 14 supplies driving power for driving the photo IC 12. The driving unit 14 has the fist driving power output terminal 23, from which a voltage for driving the photo IC 12 is outputted. In the case of the second embodiment, the first driving power output terminal 23 is connected to the grounding terminal 22 of the photo IC 12. When the outputted voltage signal is a pulse-like signal, the photo IC 12 is intermittently driven. This embodiment can alternately output a signal representing a voltage of 5 V and a signal representing a voltage of 0 V from the first driving power output terminal 23 as pulse voltage signals.

In the photo IC 12 of this embodiment, a voltage of 5 V is always applied to the driving power input terminal 21, so that the photo IC 12 operates when a voltage of 0 V is applied to the grounding terminal 22. That is, when the voltage outputted from the first driving power output terminal 23 is 0 V, the photo IC 12 operates. Conversely, when the voltage outputted therefrom is 5 V, the photo IC 12 stops operating. Therefore, the photo IC can intermittently be driven by causing the driving unit 14 to output the pulse voltage signal.

Incidentally, as will be described later, a bypass capacitor C may be connected in parallel with the photo IC 12 by being inserted between a pair of power supply terminals (namely, the driving power input terminal 21 and the grounding terminal 22 shown in FIG. 2) of the photo IC 12.

Figure 3:
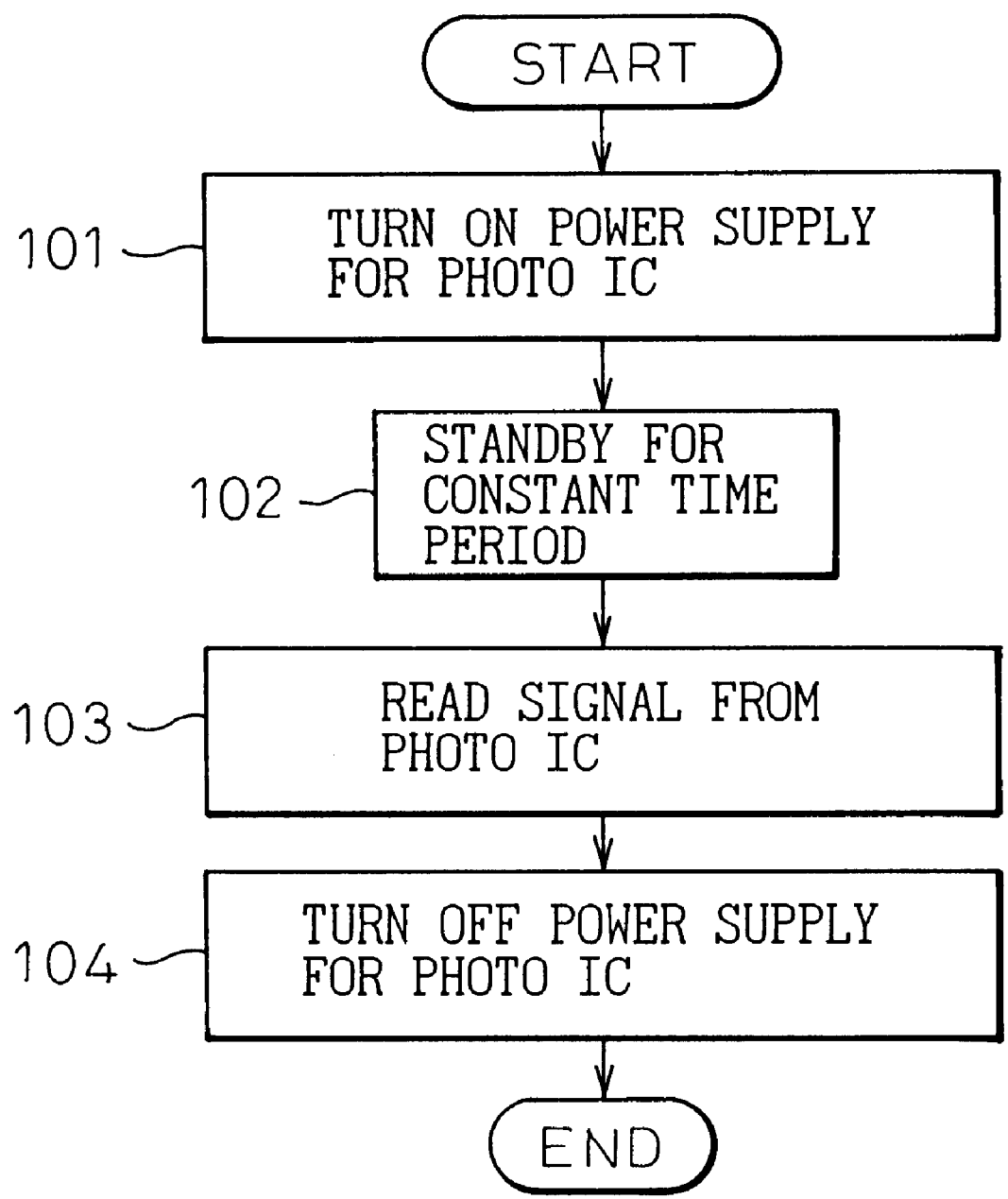
FIG. 3 is a flowchart illustrating an operation of the encoder that is the first or second embodiment of the present invention.

FIG. 3 is a flowchart illustrating an operation of the encoder that is the first or second embodiment of the present invention.

In the case of the first and second embodiments of the present invention, the driving unit 14 can supply pulse voltages to the photo IC as a driving power supply therefor. Thus, the photo IC 12 can be intermittently driven. However, just after the power supply for the photo IC 12 is turned on, and when a signal representing a voltage of 5V (in the case of the second embodiment, a voltage of 0 V) is outputted from the first driving power output unit 23 in the first embodiment, the internal state of the photo IC 12 is unstable. At that time, noises are superposed on the outputted signal, so that the outputted signal is not normal. Thus, according to the present invention, the photo IC 12 is placed on standby for outputting a signal for a set time period from the time when the power supply for the photo IC 12 is turned on to the time when the internal state of the photo IC 12 becomes stable.

When a signal representing a voltage of 5 V (a voltage of 0 V in the case of the second embodiment) is outputted from the first driving power output terminal 23 of the driving unit 14 in the first embodiment, the power supply for the photo IC 12 is turned on at step 101 of FIG. 3.

Subsequently, at step 102, for a set standby time, the photo IC 12 is placed on standby for outputting a signal. Such a standby time is a time period, for example, 20 μs, required to stabilize the internal state of the photo IC 12.

Then, at step 103, the photo IC 12 performs the sampling of resultant signals obtained by light reception. The sampled signals are read by a coordinate processing unit (not shown), such as a microcomputer, at the subsequent stage. Thereafter, the coordinate processing means outputs the read signal to the host computer.

Subsequently, at step 104, in the case of the first embodiment, a voltage of 0 V (however, a voltage of 5 V in the case of the second embodiment) is outputted from the first driving power output terminal 23. Thus, the power supply for the photo IC 12 is turned off.

A time, in which operations at steps 101 to 104 are performed, is a time period during which a signal representing a volt of 5 V in the case of the first embodiment (in the case of the second embodiment, a signal representing a voltage of 0 V) is outputted from the first driving power output terminal 23 and is, for instance, 0.5 seconds to ensure a normal operation of the photo IC even when intermittently driven. In the case that the duty ratio of the pulse voltage signal is 50%, the time period, in which the operations at steps 101 to 104 are performed, is half the period of the pulse voltage signal.

As described above, according to the first and second embodiments of the present invention, the electric current consumption of the encoder 1 can be reduced by intermittently driving the photo IC 12.

Figure 4:
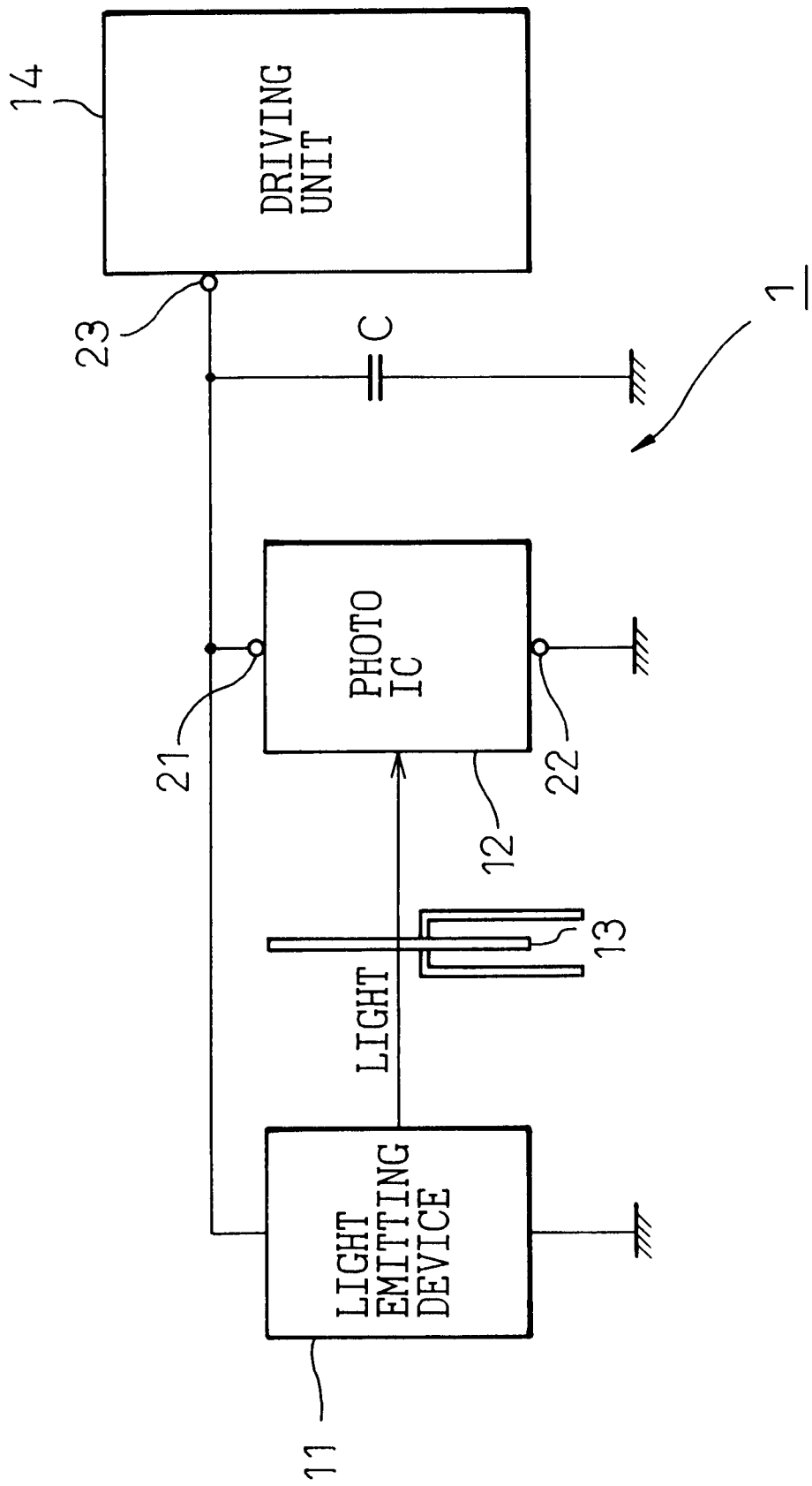
FIG. 4 is a diagram illustrating the principle and constitution of another encoder that is a third embodiment of the present invention.

FIG. 4 is a diagram illustrating the principle and constitution of an encoder that is a third embodiment of the present invention.

This embodiment is featured in that the photo IC 12 is intermittently driven as in the case of the first embodiment, and the light emitting device 11 is also intermittently driven in synchronization with the intermittent driving operation performed on the photo IC 12, and that an equal amount of driving power is supplied from the first driving power output terminal to each of the photo IC 12 and the light emitting device 11.

The encoder 1 of this embodiment comprises constituent elements similar to those of the encoder of the first embodiment. However, in the case of the encoder 1 of the third embodiment, the first driving power output terminal 23 of the driving unit 14 is connected to the driving power input terminal 21 of the photo IC 21 and to the anode of the light emitting device 11. The grounding terminal 22 of the photo IC 12 is grounded. The rest of the third embodiment is similar to the first embodiment.

The driving unit 14 supplies driving power for driving the photo IC 12 and the light emitting device 11. The driving unit 14 has the first driving power output terminal 23 that is connected to the driving power input terminal 21 of the photo IC 12 and to the anode of the light emitting device 11.

Voltages for driving the photo IC 12 and the light emitting device 11 are outputted from the first driving output terminal 23. The light emitting device 11 and the photo IC 12 operate when the pulse voltage outputted from the first driving power output terminal 23 is 5 V. Further, the light emitting device 11 and the photo IC 12 stop operating when the pulse voltage outputted therefrom is 0 V. This embodiment can alternately output a signal representing a voltage of 5 V and a signal representing a voltage of 0 V from the first driving power output terminal 23 as pulse voltage signals.

Incidentally, as will be described later, a bypass capacitor C may be connected in parallel with the photo IC 12 by being inserted between a pair of power supply terminals (namely, the driving power input terminal 21 and the grounding terminal 22 shown in FIG. 4) of the photo IC 12.

Additionally, in the case of using the encoder 1 of this embodiment for detecting the rotation of the ball contained in the coordinate input device, as in the case of the aforementioned embodiments, it is sufficient that the microcomputer incorporated into the coordinate input device has the function of the driving unit 14 of the third embodiment, and that at that time, one of free output ports of the microcomputer may be allotted to the first driving power output terminal 23.

Figure 5:
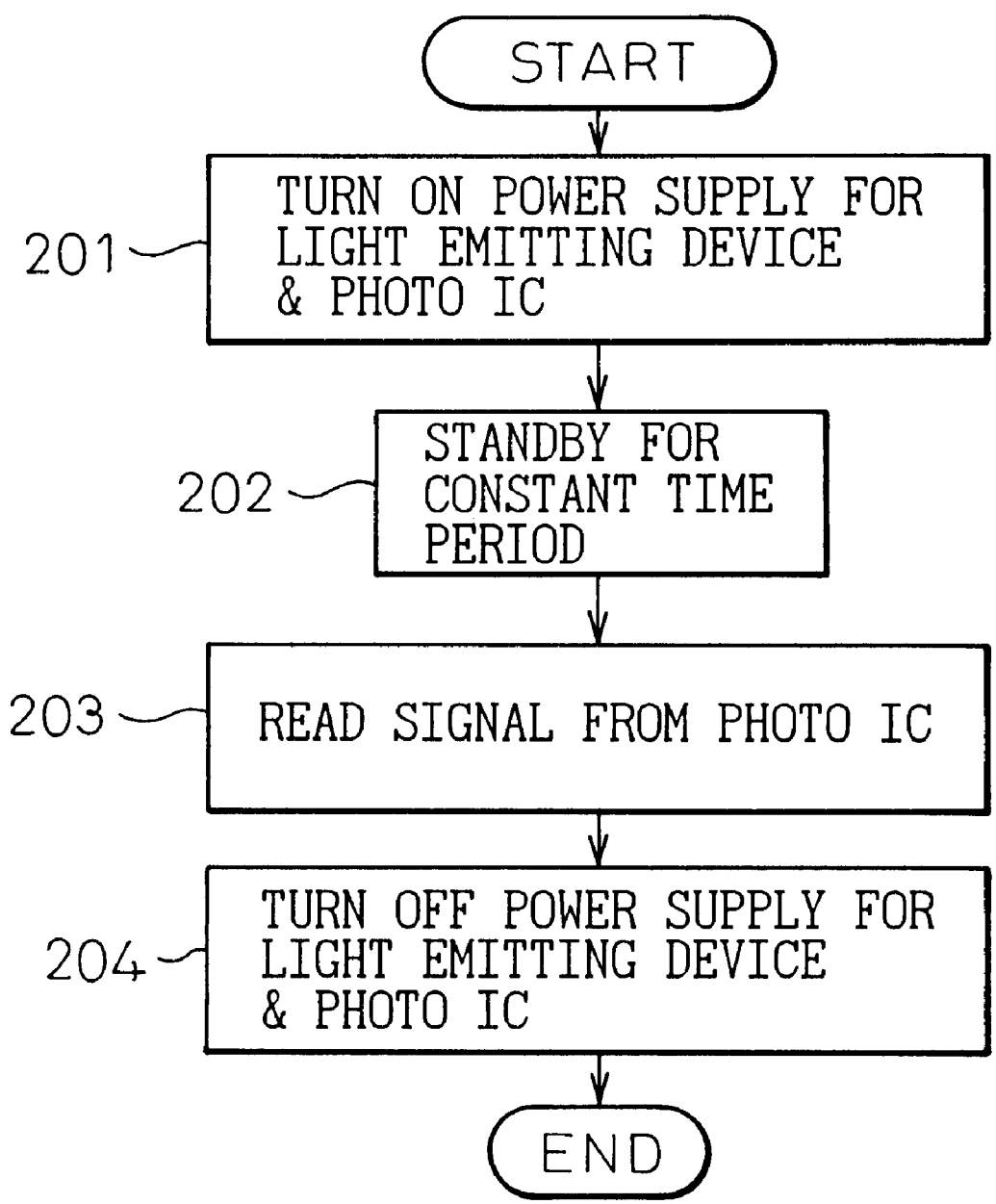
FIG. 5 is a flowchart illustrating an operation of the encoder that is the third embodiment of the present invention.

FIG. 5 is a flowchart illustrating an operation of the encoder that is the third embodiment of the present invention.

As described above, in the case of the third embodiment of the present invention, the driving unit 14 supplies both the driving power for the light emitting device 11 and the driving power for the photo IC 12. When the pulse voltage signals are outputted from the first driving power output terminal 23, the light emitting device 11 and the photo IC 12 are intermittently driven in synchronization with each other.

When a voltage of 5 V is outputted from the driving power output terminal 23 of the driving unit 14, the light emitting device 11 and the photo IC 12 are turned on at step 201 shown in FIG. 5.

Subsequently, at step 202, for a set standby time, the photo IC 12 is placed on standby for outputting a signal. Such a standby time is a time period of, for example, 20 µs, which is required to stabilize the internal state of the photo IC 12.

Then, at step 203, the photo IC 12 performs the sampling of resultant signals obtained by light reception. The sampled signals are read by a coordinate processing unit (not shown), such as a microcomputer, at the subsequent stage. Thereafter, the coordinate processing means outputs the read signal to the host computer.

Subsequently, at step 204, in the case of the first embodiment, a voltage of 0 V is outputted from the first driving power output terminal 23. Thus, the power supply for the photo IC 12 and the power supply for the photo IC 12 are turned off.

A time, in which operations at steps 201 to 204 are performed, is a time period during which a signal representing a volt of 5 V is outputted from the first driving power output terminal 23, and is, for instance, 0.5 seconds which can ensure a normal operation of the photo IC 12 even when intermittently driven.

As described above, according to the third embodiment of the present invention, the electric current consumption of the encoder 1 can be reduced still more, as compared with the first and second embodiments, by intermittently driving both the photo IC 12 and the light emitting device 11.

Figure 6:
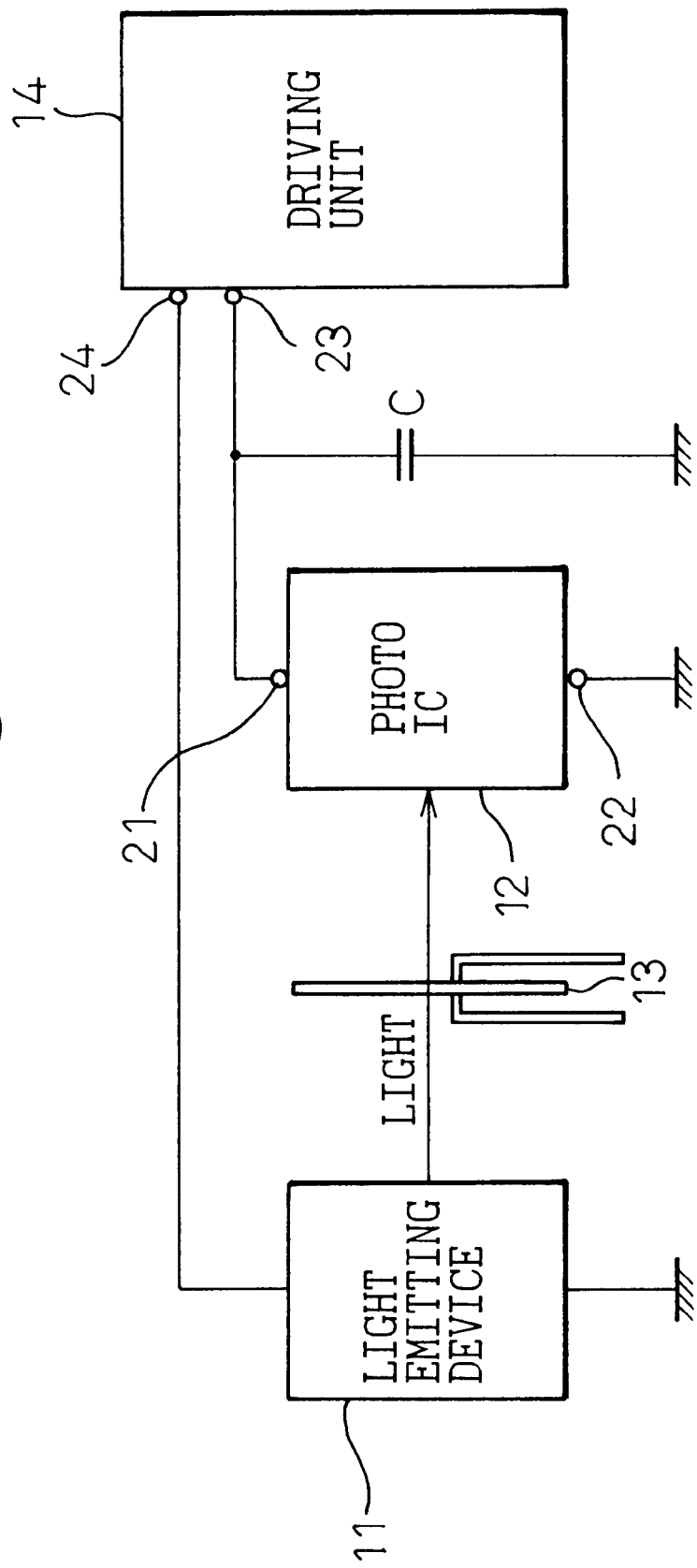
FIG. 6 is a diagram illustrating the principle and constitution of another encoder that is a fourth embodiment of the present invention.

FIG. 6 is a diagram illustrating the principle and constitution of an encoder that is a fourth embodiment of the present invention.

As in the third embodiment, the fourth embodiment can intermittently drive the light emitting device 11 and the photo IC 12 by using pulse voltage signals. However, in this embodiment the driving power output terminals of the driving unit 14 are respectively connected to the light emitting device 11 and the photo IC 12, so that the light emitting device 11 and the photo IC 12 can be separately driven.

The encoder 1 of the fourth embodiment has constituent elements similar to those of each of the aforementioned embodiments.

The driving unit 14 has a first driving power output terminal 23 and a second driving power output terminal 24. The first driving power output terminal 23 is connected to the driving power input terminal 21 of the photo IC 12, while the second driving power output terminal 24 is connected to the anode of the light emitting device 11. The grounding terminal of the photo IC 12 is grounded.

The voltages for driving the photo IC 12 and the light emitting device 11 can be outputted from the first driving power output terminal 23 and the second driving power output terminal 24, respectively. When pulse voltage signals are outputted, the photo IC 12 and/or the light emitting device 11 can be intermittently driven.

Incidentally, as will be described later, a bypass capacitor C may be connected in parallel with the photo IC 12 by being inserted between a pair of power supply terminals (namely, the driving power input terminal 21 and the grounding terminal 22 shown in FIG. 6) of the photo IC 12.

Additionally, in the case of using the encoder 1 of this embodiment for detecting the rotation of the ball contained in the coordinate input device, as in the case of the aforementioned embodiments, it is sufficient that the microcomputer incorporated into the coordinate input device has the function of the driving unit 14 of the third embodiment, and that at that time, two of the free output ports of the microcomputer may be allotted to the first driving power output terminal 23 and the second driving power output terminal 24, respectively.

Figure 7:
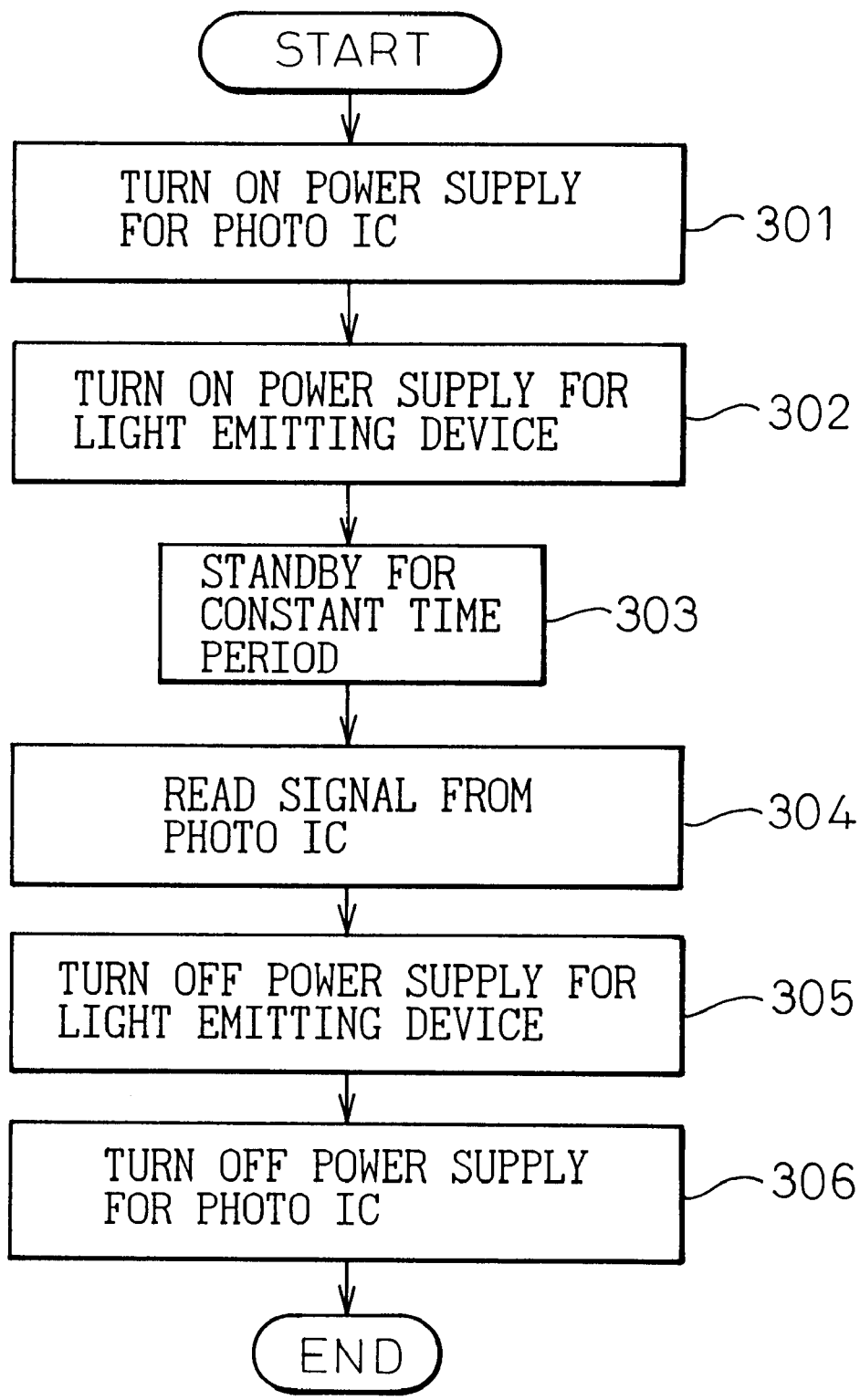
FIG. 7 is a flowchart illustrating an operation of the fourth embodiment of the present invention.

FIG. 7 is a flowchart illustrating an operation of the encoder that is the fourth embodiment of the present invention.

As described above, the driving power output terminals of the driving unit 14 are connected to the light emitting device 11 and the photo IC 12, respectively. Thus, the light emitting device 11 and the photo IC 12 can be individually driven.

In the case of this embodiment, both the light emitting device 11 and the photo IC 12 can be intermittently driven. For example, the power supply for the photo IC is turned on before the power supply for the light emitting device 11 is turned on. Moreover, the power supply for the light emitting device 11 is turned off after the power supply for the photo IC 12 is turned off. Therefore, the pulse voltage signals outputted from the first driving power output terminal 23 and the second driving power output terminal 24 are equal in pulse period to each other but differ in duty ratio from each other.

Figure 8:
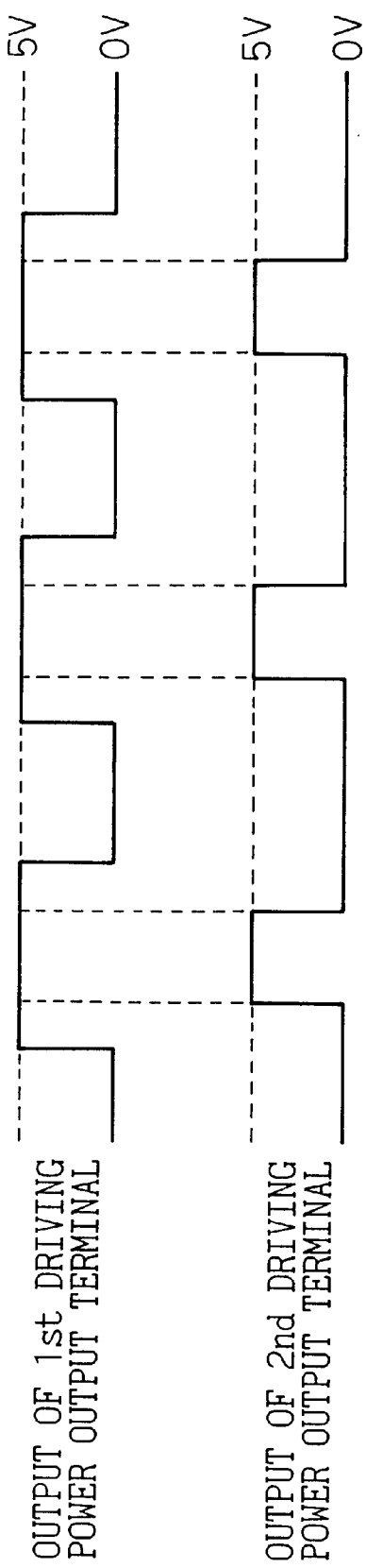
FIG. 8 is a waveform chart illustrating a pulse voltage signal for intermittently driving devices of the fourth embodiment of the present invention.

FIG. 8 is a waveform chart illustrating a pulse voltage signal for intermittently driving devices of the fourth embodiment of the present invention.

As illustrated in FIG. 8, the pulse voltage signal outputted from the first driving power output terminal 23 is larger in duty ratio than the pulse voltage signal outputted from the second driving power output terminal 24. Although the pulse periods of the pulse voltage signals outputted from the first driving power output terminal 23 and the second driving power output terminal 24 are equal to each other, the rise of the pulse voltage signal outputted from the first driving power output terminal 23 is caused earlier than that of the pulse voltage signal outputted from the second driving power output terminal 24. Conversely, the fall of the pulse voltage signal outputted from the first driving power output terminal 23 occurs later than that of the pulse voltage signal outputted from the second driving power output terminal 24. Such pulse voltages are applied to the driving power input terminal 21 of the photo IC 12 and to the anode of the light emitting device 11. Consequently, the power supply for the photo IC 12 can be turned on earlier than the light emitting device 11. Moreover, the power supply for the light emitting device 11 can be turned off later than the photo IC 12.

When a voltage of 5 V is outputted from the first driving power output terminal 23 of the driving unit 14, the power supply for the photo IC 12 is turned on at step 302 shown in FIG. 7.

When a voltage of 5V is outputted from the second driving power output terminal 24 later than the output from the first driving power output terminal 23, the power supply for the light emitting device 11 is turned on at step 302 of FIG. 7.

Subsequently, at step 303, for a set standby time, the photo IC 12 is placed on standby for outputting a signal. Such a standby time is a time period, for example, 20 μs, required to stabilize at least the internal state of the photo IC 12.

Then, at step 304, the photo IC 12 performs the sampling of resultant signals obtained by light reception. The sampled signals are read by a coordinate processing unit (not shown), such as a microcomputer, at the subsequent stage. Thereafter, the coordinate processing means outputs the read signal to the host computer.

Subsequently, at step 305, in the case of the fourth embodiment, a voltage of 0 V is outputted from the second driving power output terminal 23. Thus, the power supply for the photo IC 12 is turned off.

Then, at step 306, a voltage of 0 V is outputted from the second driving power output terminal 23. Thus, the power supply for the photo IC 12 is turned off.

Incidentally, the pulse voltages illustrated in FIG. 8 are merely examples. This embodiment is adapted to intermittently drive the respective of the light emitting device 11 and the photo IC 12 by using two kinds of pulse voltage signals, which differ in duty ratio from each other. For example, the power supply for the photo IC 12 is turned on earlier than the power supply for the light emitting device 11. Further, the power supply for the light emitting device 11 is turned off later than the power supply for the photo IC 12. However, as in the case of the third embodiment, the operation of intermittently driving the light emitting device 11 may be synchronized with the operation of intermittently driving the photo IC 12 by outputting pulse voltage signals, which are equal in duty ratio and pulse period to each other, from the first driving power output terminal 23 and the second driving power output terminal 24 in synchronization with each other.

Furthermore, the pulse voltage signals may be adapted so that the rise of the pulse voltage signal outputted from the first driving power output terminal 23 is caused simultaneously with or earlier than the rise of the pulse voltage signal outputted from the second driving power output terminal 24, and that the fall of the pulse voltage signal outputted from the first driving power output terminal 23 is caused simultaneously with or later than the fall of the pulse voltage signal outputted from the second driving power output terminal 24.

Further, the pulse voltage signals may be applied only to the photo IC 12 by always applying a voltage of 5 V, which serves as a pulse voltage having a duty ratio of 100%, to the anode of the light emitting device 11. Consequently, the fourth embodiment can have advantageous effects similar to those of the first and second embodiments described with reference to FIGS. 1 and 2.

As described above, according to the fourth embodiment of the present invention, the electric current consumption of the encoder 1 can be reduced still more by intermittently driving both the photo IC 12 and the light emitting device 11.

Further, in the case of the fourth embodiment, the terminals, from which driving voltages for driving the driving unit 14 are individually connected to the light emitting device 11 and the photo IC 12, so that the light emitting device 11 and the photo IC 12 can be individually driven. Consequently, the range of uses, to which such an encoder 1 can be applied, is widen.

Figure 9:
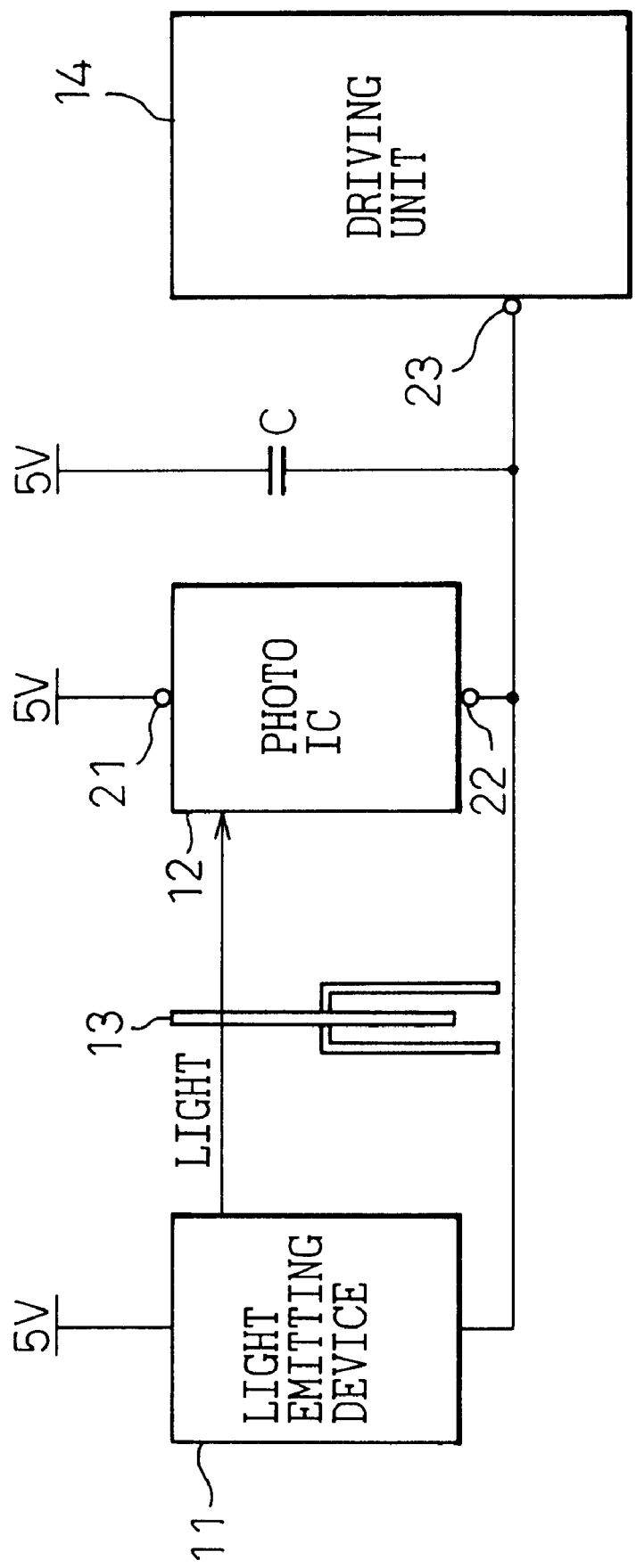
FIG. 9 is a diagram illustrating the principle and constitution of another encoder that is a fifth embodiment of the present invention.

FIG. 9 is a diagram illustrating the principle and constitution of a fifth embodiment of the present invention.

This embodiment is an alternate to the third embodiment and similar to the third embodiment in that an equal amount of driving power is supplied from the first driving output terminal 23 to both the photo IC 12 and the light emitting device 11. However, the fourth embodiment is featured in that the first driving power output terminal 23 is connected to the grounding terminal 22 of the photo IC 12 and the cathode of the light emitting device.

The encoder 1 according to this embodiment comprises constituent elements similar to those of each of the aforementioned embodiments. Incidentally, as will be described later, a bypass capacitor C may be connected in parallel with the photo IC 12 by being inserted between a pair of power supply terminals (namely, the driving power input terminal 21 and the grounding terminal 22 shown in FIG. 9) of the photo IC 12.

A voltage of 5V is always applied to the driving power input terminal 21 of the photo IC12 and to the anode of the light emitting device 11. The first driving power output terminal 23 of the driving unit 14 is connected to the grounding terminal 22 of the photo IC 12 and to the cathode of the light emitting device 11.

As described in the foregoing description of the second embodiment, when a voltage of 0 V is applied to the grounding terminal 22 in the case that a voltage of 5 V is always applied to the driving power input terminal 21 of the photo IC 12, the photo IC 12 operates. Similarly to this, the light emitting device 11, to the anode of which a voltage of 5 V is applied, operates when a voltage of 0 V is applied to the cathode thereof. That is, both the photo IC 12 and the light emitting device 11 operate when the voltage outputted from the first driving power output terminal 23 is 0 V, and stops operating when such a voltage is 5 V. Therefore, when pulse voltages for intermittently driving the photo IC 12 and the light emitting device 11 are outputted thereto from the first driving power output terminal 23 of the driving unit 14, the photo IC 12 and the light emitting device 11 can operate in synchronization with each other.

Incidentally, an operation of the fifth embodiment is illustrated by a flowchart similar to the flowchart of FIG. 5.

Figure 10:
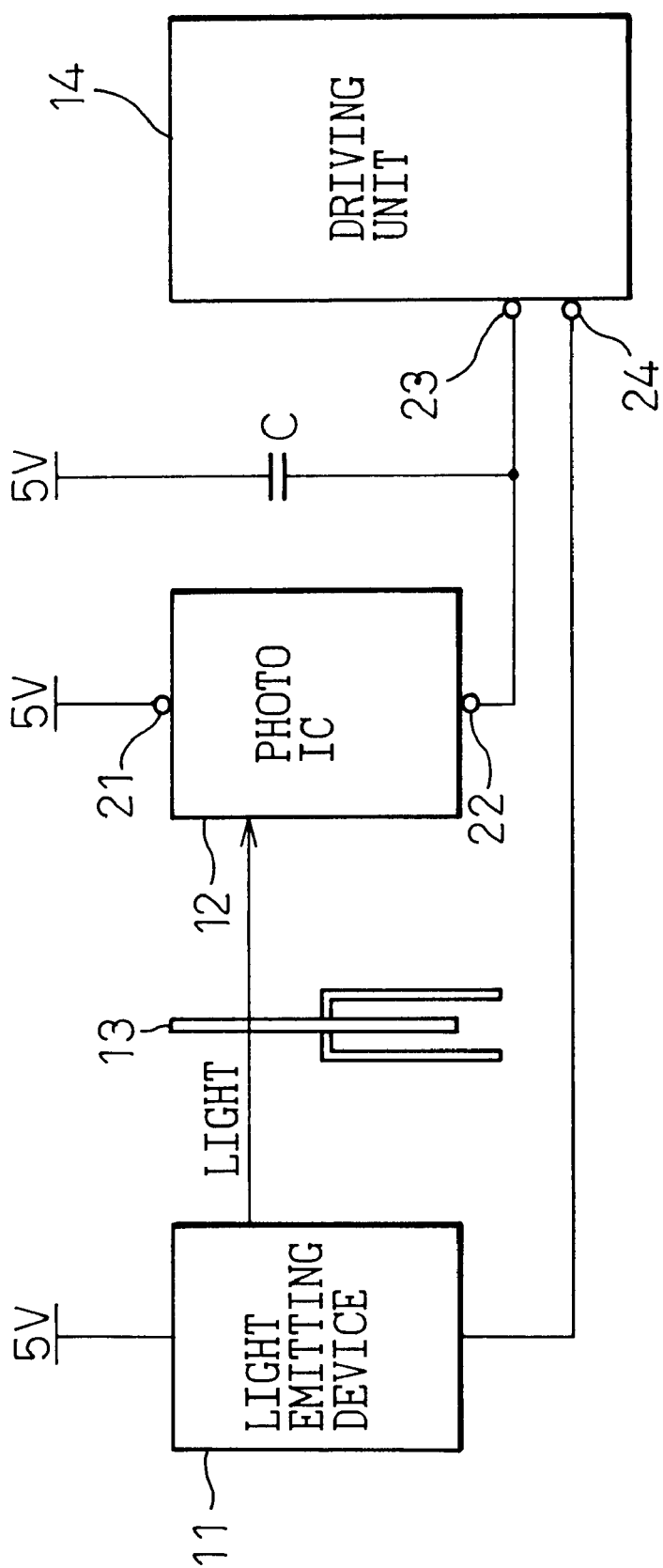
FIG. 10 is a diagram illustrating the principle and constitution of another encoder that is a sixth embodiment of the present invention.

FIG. 10 is a diagram illustrating the principle and constitution of an encoder that is a sixth embodiment of the present invention.

This embodiment is an alternative to the fourth embodiment, and is similar thereto in that the terminals, from which driving voltages for driving the driving unit 14 are outputted, are connected to the light emitting device 11 and the photo IC 12, respectively, and that the light emitting device 11 and the photo IC 12 can be individually driven. However, the sixth embodiment differs from the fourth embodiment in that the first driving power output terminal 23 is connected to the grounding terminal 22 of the photo IC 12, while the second driving power output terminal 24 is connected to the cathode of the light emitting device 11.

The encoder 1 according to this embodiment comprises constituent elements similar to those of each of the aforementioned embodiments. Incidentally, as will be described later, a bypass capacitor C may be connected in parallel with the photo IC 12 by being inserted between a pair of power supply terminals (namely, the driving power input terminal 21 and the grounding terminal 22 shown in FIG. 10) of the photo IC 12.

A voltage of 5 V is always applied to the anode of the driving power input terminal 21 of the photo IC 21 and to the anode of the light emitting device 11.

The driving unit 14 has the first driving power output terminal 23 and the second driving power output terminal 24. The first driving power output terminal 23 is connected to the grounding terminal 22 of the photo IC 12, while the second driving power output terminal 24 is connected to the cathode of the light emitting device 11.

A signal representing a voltage for driving the photo IC 12 and a signal representing a voltage for driving the light emitting device 11 are outputted from the first driving power output terminal 23 and the second driving power output terminal 24, respectively. When the outputted voltage signal is a pulse-like signal, each of the photo IC 12 and the light emitting device 11 is intermittently driven.

As described in the foregoing description of the fifth embodiment, the light emitting device 11 and the photo IC 12 operate when the voltage outputted from the first driving power output terminal 23 is 0 V. Conversely, the light emitting device 11 and the photo IC 12 stop operating when the voltage outputted from the terminal 23 is 5 V. Therefore, as described in the foregoing description with reference to the flowchart of FIG. 7, for example, in the case that the power supply for the photo IC 12 is turned on earlier than the power supply for the light emitting device 11, and that the power supply for the light emitting device 11 is turned off later than the power supply for the photo IC 12, it is sufficient to set the duty ratio of the pulse voltage signal outputted from the first driving power output terminal 23 of the driving unit 14 in such a manner as to be smaller than the duty ratio of the pulse voltage signal outputted from the second driving power output terminal 24 thereof.

That is, it is sufficient to apply to the driving power input terminal 21 of the photo IC 12 and the anode of the light emitting device 11 the pulse voltage signals adapted so that the pulse period of the pulse voltage signal outputted from the first driving power output terminal 23 is equal to the pulse period of the pulse voltage signal outputted from the second driving power output terminal 24, that the fall of the pulse voltage signal outputted from the first driving power output terminal 23 is caused earlier than the fall of the pulse voltage signal outputted from the second driving power output terminal 24, and that the rise of the pulse voltage signal outputted from the first driving power output terminal 23 is caused later than the rise of the pulse voltage signal outputted from the second driving power output terminal 24.

Incidentally, in the case of the sixth embodiment of the present invention, the light emitting device 11 and the photo IC 12 can be individually and intermittently driven by using two kinds of pulse voltage signals. However, as in the case of the fifth embodiment, the operation of intermittently driving the light emitting device 11 may be synchronized with the operation of intermittently driving the photo IC 12 by outputting the pulse voltages, which have the same duty ratio and pulse period, from the first driving power output terminal 23 and the second driving power output terminal 24 in synchronization with each other.

The aforementioned fifth and sixth embodiments of the present invention can provide advantageous effects similar to those of the third and fourth embodiments.

As described above, in the case of the first to sixth embodiments, a low power consumption optical rotary encoder can be realized by intermittently driving the photo IC in the encoder. Furthermore, in the case of the third to sixth embodiments, both the photo IC and the light emitting device can be intermittently driven, so that the power consumption can be reduced still more.

Next, a coordinate input device having a low power consumption optical rotary encoder, which has a photo IC as a light receiving device, is described hereinbelow as a seventh embodiment of the present invention.

First, the constitution and fundamental operation of the coordinate input device, which is the seventh embodiment, are described hereinbelow.

Figure 11:
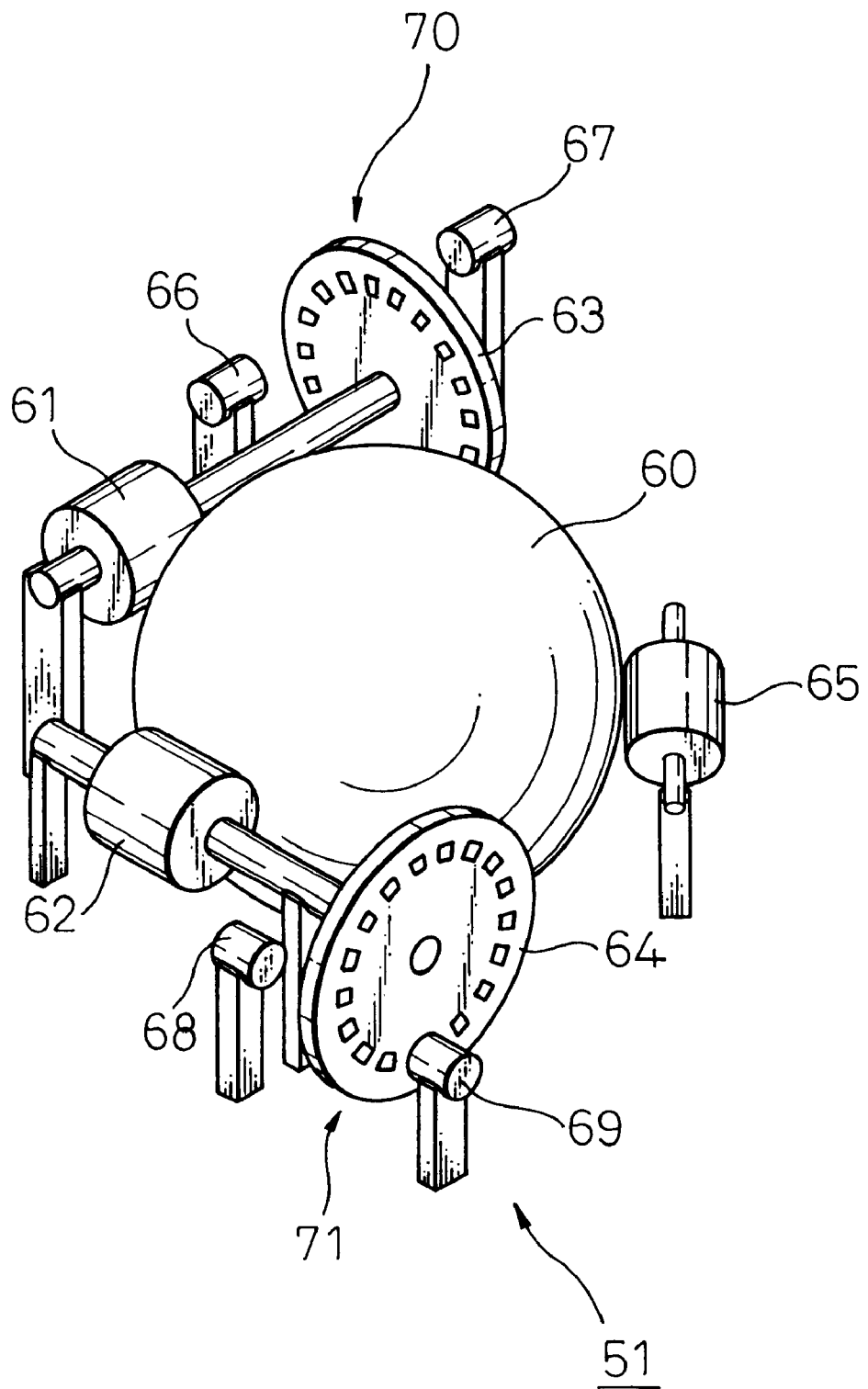
FIG. 11 is an exploded perspective diagram illustrating a coordinate input device that is a seventh embodiment of the present invention.

FIG. 11 is an exploded perspective diagram illustrating the coordinate input device that is the seventh embodiment of the present invention.

When a user operates a mouse 51, a ball 60 rotates. Further, an X-axis shaft 61 and a Y-axis shaft 62 for the ball 60 are respectively disposed along the X-axis and the Y-axis, which are orthogonal to each other, in such a manner as to touch the ball 60. To maintain the contact between the ball 60 and each of the X-axis shaft 61 and the Y-axis shaft 62, a roller 65 rotating around a shaft inclined to each of the X-axis and the Y-axis by 45 degrees is disposed.

An X-axis encoder 70 and a Y-axis encoder 71, which serve as optical rotary encoders, are attached to ends of the X-axis shaft 61 and the Y-axis shaft 62, respectively, and detect the X-axis component and the Y-axis component of each of the direction and amount of rotation of the ball 60, respectively. The X-axis encoder 70 has an X-axis slitted disk 63, an X-axis light emitting device 66, and an X-axis photo IC 67. Further, the Y-axis encoder 71 has a Y-axis slitted disk 64, a Y-axis light emitting device 68, and a Y-axis photo IC 69.

Each of the X-axis slitted disk 63 and the Y-axis slitted disk 64 is slit at set uniform angular intervals. A part of the light emitted from each of the X-axis light emitting device 66 and the Y-axis light emitting device 68 is transmitted by slits of a corresponding one of the slitted disks 63 and 64 respectively corresponding to the X-axis and the Y-axis. Then, such a part of the light is received by the X-axis photo IC 67 and the Y-axis photo IC 69.

As will be described later, each of the X-axis photo IC 67 and the Y-axis photo IC 69 has four photodiodes (not shown in FIG. 11). These four photodiodes are used as two photodiode pairs, each of which consists of two photodiodes. Light beams respectively received by the photodiodes of each of the pairs have phases inverted to each other (or shifted by 180 degrees). That is, each pair of photodiodes generates two signals, whose phases are inverted, from received light, and then a differential signal representing the difference between the two signals is obtained, and further an electric pulse signal is outputted by shaping the waveform of the differential signal into a rectangular waveform.

As will be described later, the two pairs of photodiodes are placed side by side. The phase of electric pulse signals outputted from the two photodiode pairs depends on the direction of rotation of the slitted disk. Thus, the direction of rotation of the disk is known from the direction of the shift of this phase, while the amount of rotation of the slitted disk is known from the number of counts.

Figure 12:
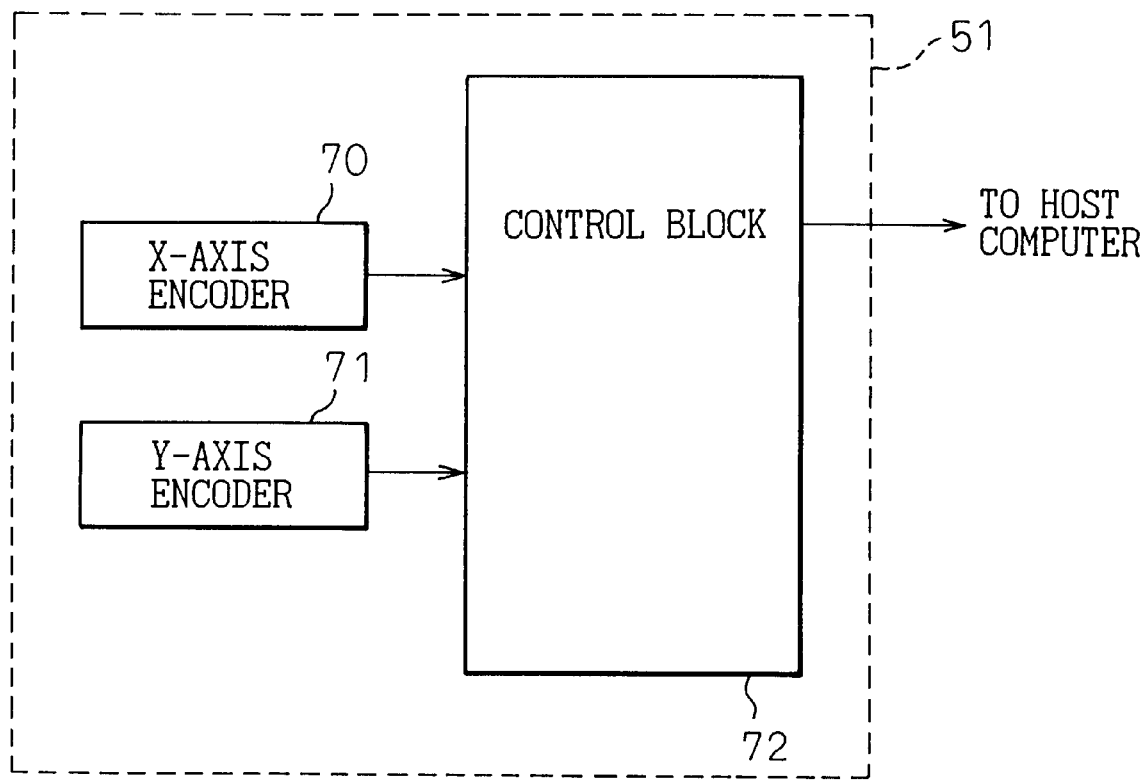
FIG. 12 is a diagram illustrating the circuit constitution of the coordinate input device that is the seventh embodiment of the present invention.

FIG. 12 is a diagram illustrating the circuit constitution of the coordinate input device that is the seventh embodiment of the present invention.

The X-axis encoder 70 and the Y-axis encoder 71 are connected to a control block 72 implemented by a microcomputer contained in the mouse 51. Similarly, signal lines (not shown) drawn from left and right click switches of the mouse 51 are connected to the control block 72.

The control block 72 detects the direction and amount of movement of the coordinate input device 51 from pulse signals outputted from photodiodes pairs, which will be described later, of the X-axis encoder 70 and the Y-axis encoder 71. The control block 72 transmits data, which represents the detected direction and amount of movement of the coordinate input device 51 and is in a predetermined format, to a host computer together with information received from the left and right click switches (not shown).

Next, the constitution and operating principle of the optical rotary encoder in the seventh embodiment of the present invention will be described hereinbelow. Incidentally, for simplicity, the constitution and operating principle of only the X-axis encoder 70 are described hereinafter by way of example. However, the constitution and operating principle of the Y-axis encoder 71 are similar to those of the encoder 70.

Figure 13:
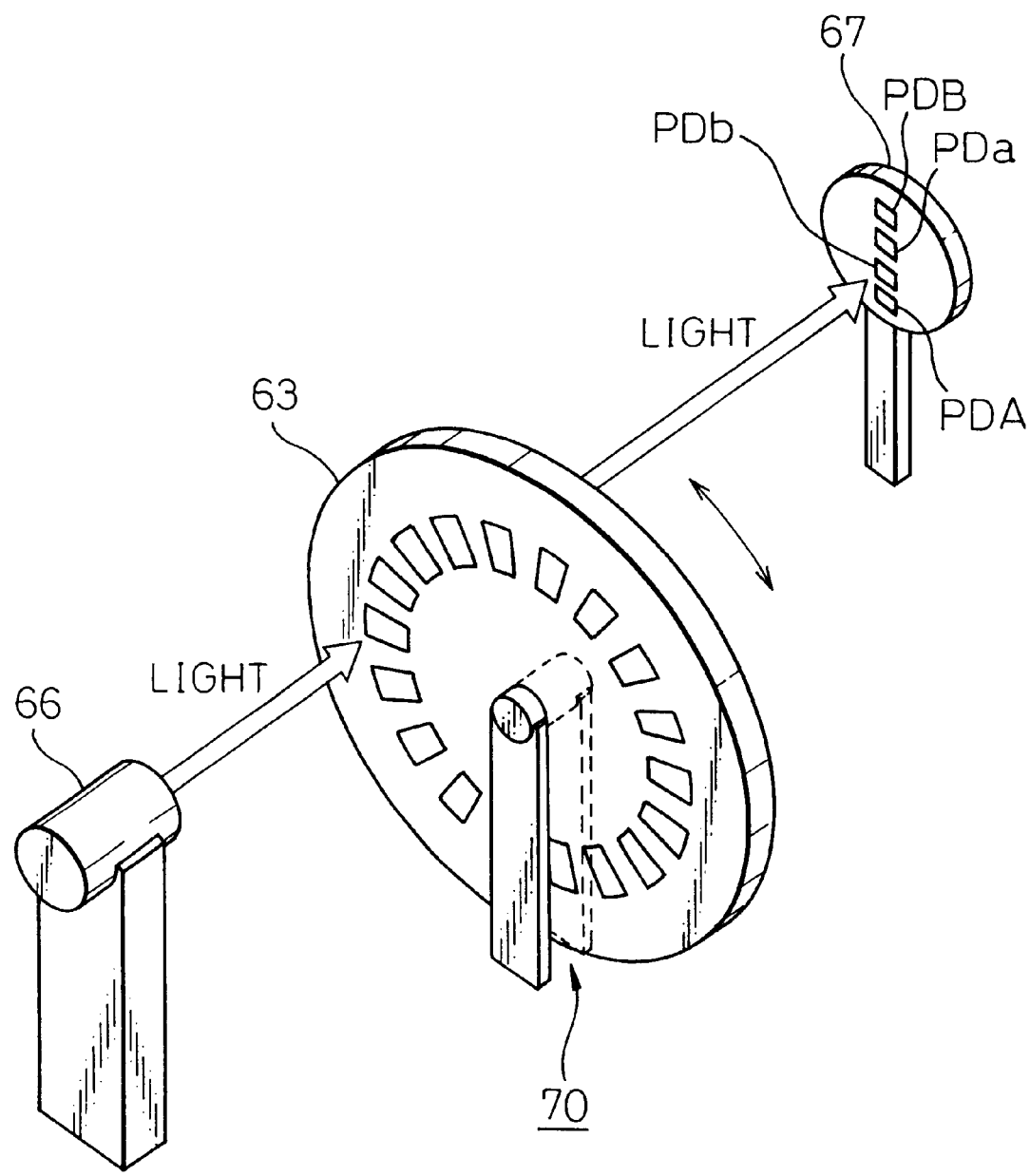
FIG. 13 is an exploded perspective diagram illustrating an optical rotary encoder of the seventh embodiment of the present invention.
Figure 14:
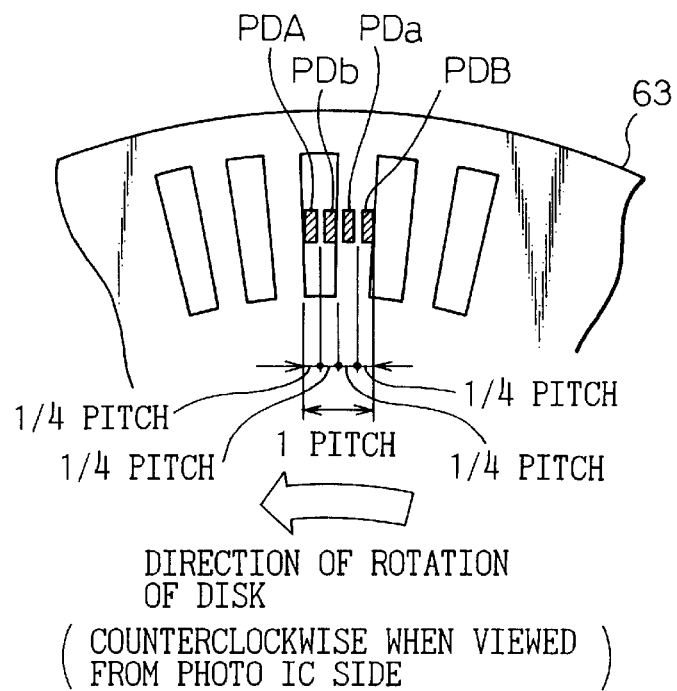
FIG. 14 is a schematic diagram illustrating the positional relation between a photo IC and slits.
Figure 15:
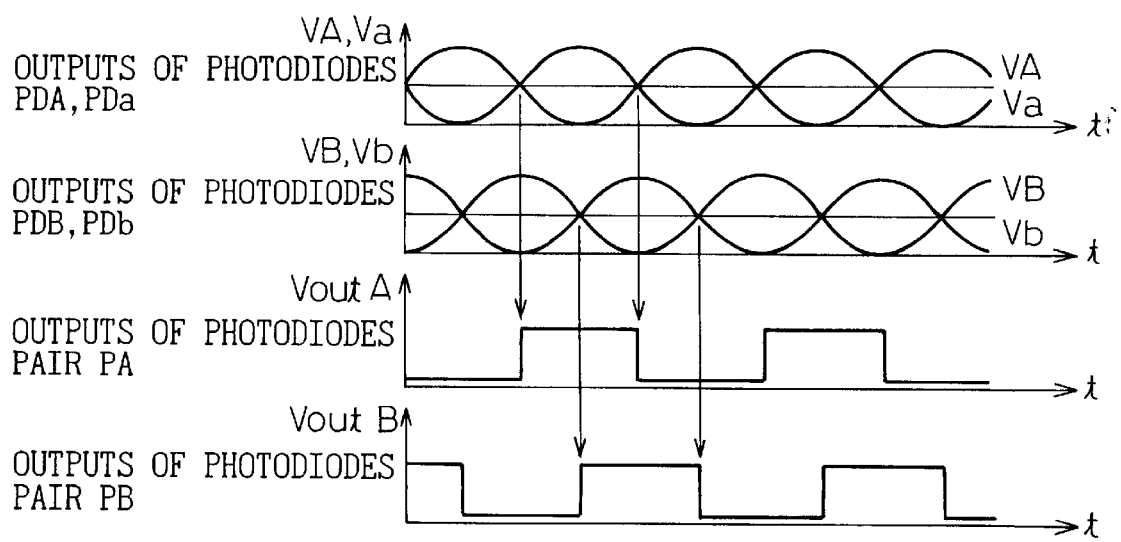
FIG. 15 is a time chart illustrating outputs of photo ICs.

FIG. 13 is an exploded perspective diagram illustrating the optical rotary encoder in the seventh embodiment of the present invention. FIG. 14 is a schematic diagram illustrating the positional relation among the photo IC and the slits. FIG. 15 is a time chart illustrating an output of the photo IC.

As illustrated in FIG. 13, the X-axis encoder 70 has the X-axis slitted disk 63, the X-axis light emitting device 66, and the X-axis photo IC 67. The X-axis photo IC 67 has four photodiodes PDA, PDa, PDB, and PDb, which are used as two pairs of photodiodes. Hereunder, a pair of the photodiodes PDA and PDa will be referred to as a photodiode pair PA. Further, a pair of the photodiodes PDB and PDb will be referred to as a photodiode pair PB.

As described with reference to FIG. 14, the four photodiodes PDA, PDa, PDB, and PDb are provided correspondingly to each of the slits formed in the slitted disk 63 so that outputs VA and Va of the photodiodes PDA and PDa are inverted to each other (namely, the phases thereof are shifted from each other by 180 degrees) and outputs VB and Vb of the photodiodes PDB and PDb are similarly inverted to each other, as illustrated in FIG. 15.

FIG. 14 shows a part of the X-axis slitted disk 63 as viewed from the direction of the X-axis light emitting device 66 (not shown in FIG. 14). Assuming that the distance between the adjacent slits in the X-axis slitted disk 63 as shown in FIG. 14 is defined as 1 pitch, the width of each of the slits is ½ pitch. In the case of this embodiment, in the X-axis slitted disk 63, four photodiodes PDA, PDb, PDa, and PDB are disposed every (¼) pitch in this order.

When one of the photodiodes of each of the pair of the photodiodes PDA and PDa, and the pair of the photodiodes PDB and PDb is placed in a corresponding one of the slits, the other of the photodiodes of a corresponding one of the pairs is deviated from the corresponding slit. Further, as illustrated in FIG. 14, the photodiode pair PA and the photodiode pair PB are placed in such a manner as to be shifted from each other in order to detect the direction of rotation of the slitted disk, as will be described later. With such an arrangement, when the X-axis slitted disk 63 is rotated in, for example, the direction of an arrow indicated in FIG. 14, the outputs of the photodiodes are obtained so that the outputs VA and Va of the photodiodes PDA and PDa are inverted to each other (namely, the phases thereof are shifted from each other by 180 degrees) and the outputs VB and Vb of the photodiodes PDB and PDb are similarly inverted to each other, as illustrated in FIG. 15.

Next, a fundamental operation of the photo IC is described hereinbelow.

Figure 16:
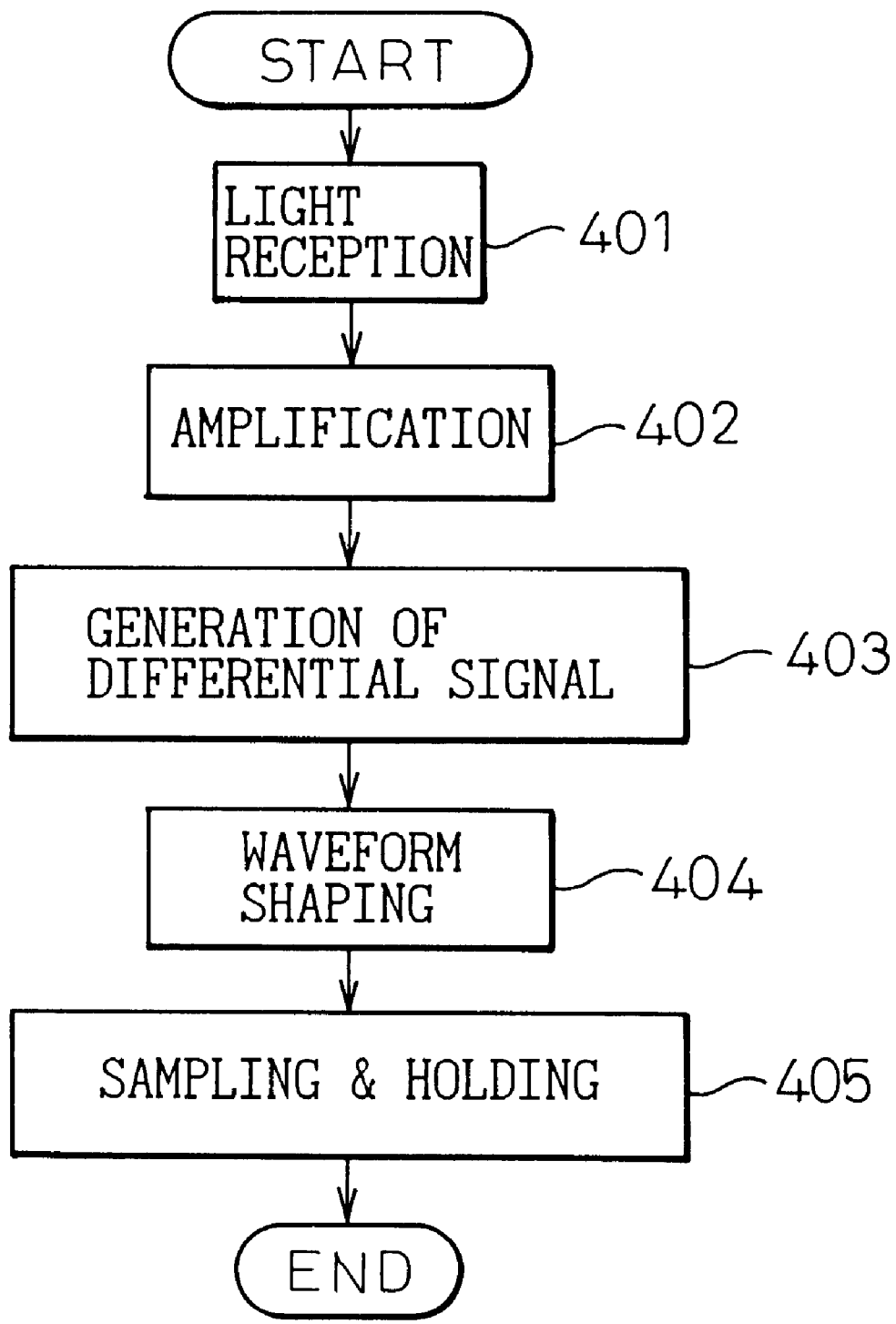
FIG. 16 is a flowchart illustrating a fundamental operation of the photo IC.

FIG. 16 is a flowchart illustrating the fundamental operation of the photo IC.

At step 401, the four photodiodes PDA, PDb, PDa, and PDB incorporated in the X-axis photo IC 67 receive a part, which is transmitted by the slits of the X-axis slitted disk 63, of the light emitted from the X-axis light emitting device 66. Then, the transmitted part of the light is amplified at step 402. In FIG. 15, signals outputted from the photodiodes PDA, PDb, PDa, and PDB at that time are illustrated as the signals VA, Va, VB, and Vb. As described above, the output signals VA and Va are inverted to each other, and similarly, the output signals VB and Vb are inverted to each other.

At step 403, differential signals are generated respectively corresponding to the photodiode pairs PA and PB by obtaining the differences between the output signals VA and Va and between the output signals VB and Vb.

Subsequently, at step 404, the waveform of each of the differential signals is shaped into a rectangular waveform, so that pulse signals VoutA and VoutB are generated as output signals of the photodiode pairs PA and PB. The photodiode pairs PA and PB are regarded as being arranged as illustrated in FIG. 14. Thus, the phases of the pulse signals VoutA and VoutB are shifted depending on the direction of rotation of the slitted disk.

Thus, the photo IC first generates the differential signals by using the four photodiodes, the number of which is twice the number of phototransistors provided in the ordinary device. Then, the photo IC generates the rectangular pulse signals. Consequently, even when a change in temperature or in amount of a luminosity of the light emitting device occurs, this embodiment can obtain stable outputs of the photo IC, as compared with the ordinary device using the phototransistors. Moreover, the generated pulse signals are binary signals and thus can be inputted directly to the coordinate input device.

Figure 17:
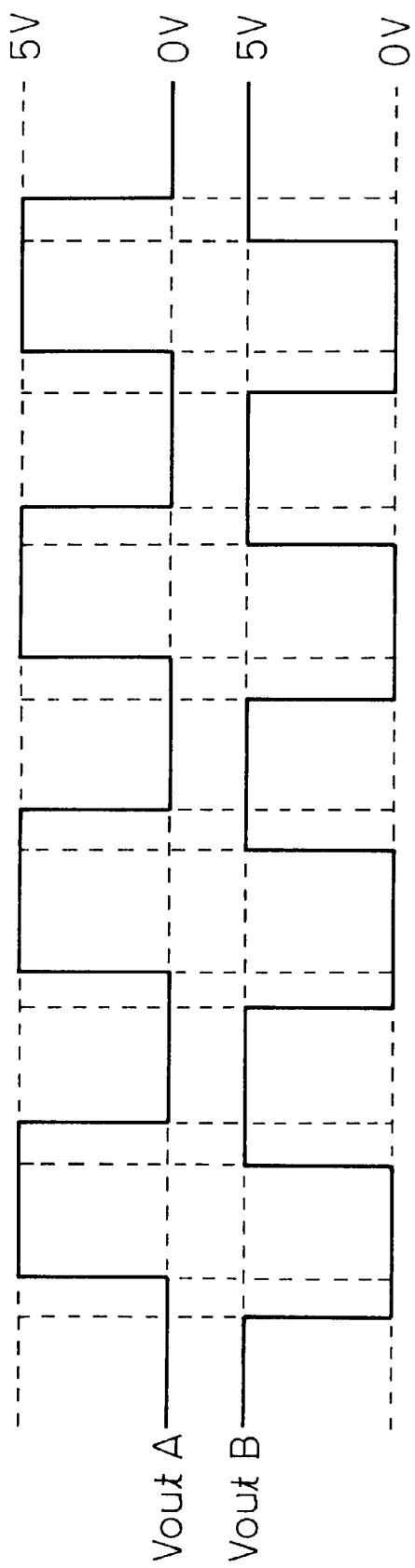
FIGS. 17 and 18 are diagrams each illustrating an operation of detecting the direction of rotation of a slitted disk.
Figure 18:
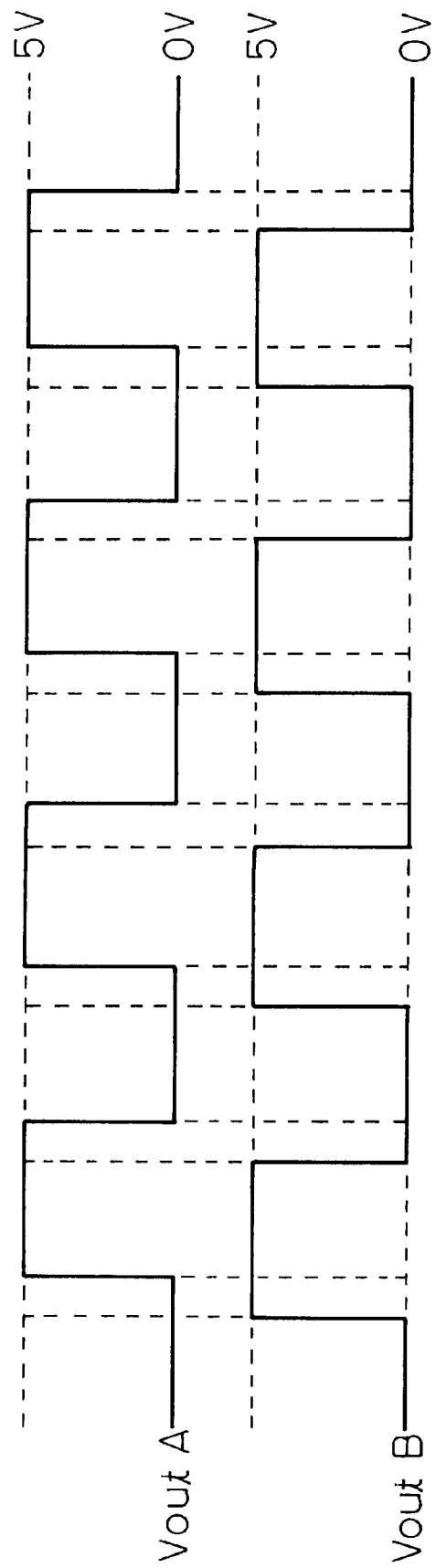

FIGS. 17 and 18 are diagrams each illustrating an operation of detecting the direction of rotation of the slitted disk.

As described above, the photodiode pairs PA and PB are arranged side by side in the photo IC. Thus, the relation in phase between the outputs VoutA and VoutB of the photodiode pairs PA and PB changes depending on the direction of rotation of the slitted disk, as illustrated in FIGS. 17 and 18. Therefore, the control block 72 can detect the direction of rotation of the slitted disk according to the relation between the pulse signals outputted from the photodiode pairs of the encoder, as illustrated in FIG. 16. Moreover, the control block 72 can detect the amount of rotation of the slitted disk by counting the number of pulses.

Thus, the direction and amount of movement of the coordinate input device 51 can be detected by the aforementioned method.

Next, an operation of intermittently driving the photo IC of the coordinate input device of the present invention is described hereinbelow.

As described above, in the case of the device using a USB interface that has been becoming widespread in recent years, generally, electric current consumption in a suspended mode of a coordinate input device is prescribed by standards. Thus, in the case of using the photo IC as the light receiving device of the encoder, it is necessary, to conform to the standards in the suspended mode, that the power consumption of the photo IC is reduced. Thus, in the case of this embodiment, the photo IC and the light emitting device of the encoder are intermittently driven so as to reduce the power consumption of the coordinate input device.

It is now assumed that the coordinate input device according to this embodiment has an ordinary mode and a suspended mode, and that the power consumption in the suspended mode of the coordinate input device should be reduced still more in view of the possibility for applying USB technology to the interface of the coordinate input device.

FIG. 19 is a table describing the combinations of the driven states of the light emitting device and the photo IC in the ordinary mode and the suspended mode of the encoder used in the coordinate input device, which is the seventh embodiment of the present invention, and the figure numbers of the figures each illustrating the principle and constitution of the corresponding encoder implementing the corresponding combination.

In the case of the coordinate input device of this embodiment, the combinations of the driven states of the photo IC and the light emitting device of the encoder are realized by the aforementioned circuit constitutions illustrated in FIGS. 1, 2, 4, 6, 9 and 10. Such circuit constitutions have been described above and thus the detail description thereof is omitted herein.

As described above, it is ideal, for reducing the power consumption, to intermittently drive the photo IC at all times. However, in such a case, a high load is imposed on the photo IC. It is, therefore, preferable that the photo IC is continuously turned on, or that the photo IC is completely turned off.

Furthermore, for instance, in the case of employing a USB interface, the electric current consumption in the ordinary mode is prescribed by the standards as being equal to or less than 100 mA. However, the electric current consumption of the coordinate input device is 60 mA at most. Thus, the photo IC may be continuously driven in the ordinary mode and intermittently driven only in the suspended mode. In this case, the driving operation can be resumed (or waken up) by detecting the movement of the coordinate input device.

Furthermore, in the case that the power supply for the photo IC is turned off in the suspended mode as illustrated in FIG. 19, the resumption (or waking-up) by detecting the movement of the coordinate input device is impossible. Thus, in this case, the device is adapted so that the driving operation can be resumed (or waken up) in the coordinate input device when the click switch provided in the coordinate input device is pushed.

Thus, the combinations of the driven states illustrated in FIG. 19 is realized by the encoders described herein-above with reference to the figures illustrating the principle and constitution thereof. Hereinafter, the case of constituting the coordinate input device by using the encoder circuit illustrated in FIG. 10 among the encoders illustrated in the figures is described in detail by way of example.

Figure 20:
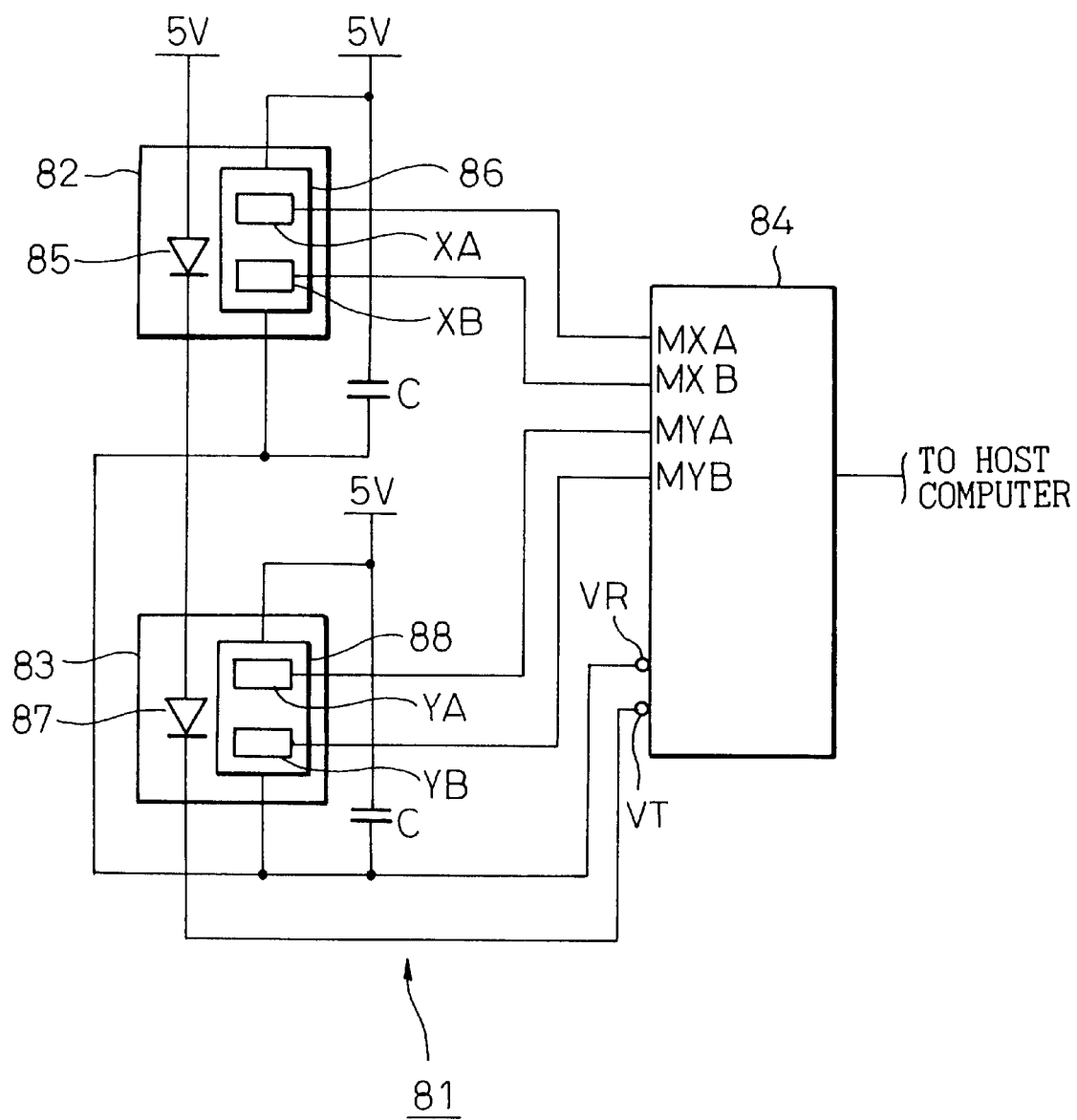
FIG. 20 is a diagram illustrating the circuit constitution of the coordinate input device that is the seventh embodiment of the present invention.

FIG. 20 is a diagram illustrating the circuit constitution of the coordinate input device that is the seventh embodiment of the present invention.

A coordinate input device 81 has an X-axis encoder 82, a Y-axis encoder 83, and a microcomputer 84. The X-axis encoder 82 has an X-axis LED serving as the light emitting device, and an X-axis photo IC 86. The Y-axis encoder 83 has a Y-axis LED 87 serving as the light emitting device, and a Y-axis photo IC 88. The X-axis photo IC 86 has two photodiode pairs XA and XB. The Y-axis photo IC 88 has two photodiode pairs YA and YB.

The microcomputer 84 is a coordinate processing unit of the coordinate input device 81. Outputs of the photodiode pairs XA, XB, YA, and YB are connected to input ports MXA, MXB, MYA, and MYB of the microcomputer 84. Binary signals outputted from the photodiode pairs are inputted to the microcomputer 84, in which the amount and direction of movement of the coordinate input device 81 are computed. Then, signals representing the computed amount and direction are outputted to the host computer.

In this embodiment, the microcomputer 84 is employed as the driving unit described with reference to FIG. 10. The cathode of the Y-axis LED 87 is connected to a free port VT of the microcomputer 84. Similarly, the grounding terminals of the X-axis photo IC 86 and the Y-axis photo IC 88 are connected to a free port VT of the microcomputer 84.

Outputs of the photo IC tend to become unstable when a pulse voltage is applied to the photo IC as the driving voltage and thus the photo IC is intermittently driven. To prevent this, a bypass capacitor is inserted in parallel with the photo IC between a pair of power supply terminals thereof. Consequently, a stable output of the photo IC can be obtained even when the photo IC is abruptly turned on or off by using the pulse voltage signal. Incidentally, a more stable output of the photo IC can be obtained by providing such a bypass capacitor between a pair of power supply terminals of each of the aforementioned photo ICs illustrated in FIGS. 1, 2, 4, 6, 9 and 10.

With such a circuit constitution, the device can be driven in the states illustrated in FIG. 19 by using a driving voltage outputted from each of the ports VT and VR of the microcomputer 84 in the ordinary mode or the suspended mode.

As described above, according to the present invention, the power consumption of the encoder can be reduced by intermittently supplying electric power to the photo IC as the driving power in an optical rotary encoder using the photo IC as the light receiving device. The instability of the outputs, which is caused by intermittently driving the photo IC, can be eliminated by inserting the photo IC between a pair of the power supply terminals of the photo IC in parallel with the photo IC.

The power consumption of the device can be reduced still more by intermittently driving the light emitting device of the encoder.

Furthermore, the power saving is achieved in the coordinate input device by using such an encoder for detecting the amount and direction of movement of the coordinate input device. Thus, the present invention is very effective, especially, in the coordinate input device using a USB interface, the power consumption of which is strictly determined by the standards.

The photo IC generates a rectangular pulse signal after a differential signal is generated by using the four photodiodes, the number of which is twice the number of phototransistors used in the ordinary device. Thus, even when change in temperature and in amount of a luminosity of the light emitting device occurs, the photo IC can obtain stable outputs, as compared with the phototransistors. Further, the generated pulse signals are binary signals, so that the pulse signals can be inputted directly to the microcomputer in the coordinate input device. Furthermore, the photo IC is an integrated circuit and thus can have various additional functions, such as a data holding function.

Although the preferred embodiments of the present invention have been described above, it should be understood that the present invention is not limited thereto and that other modifications will be apparent to those skilled in the art without departing from the sprint of the invention.

The scope of the present invention, therefore, should be determined solely by the appended claims.

What is claimed is:

1. An encoder used with a light emitting device and a photo IC for receiving light emitted from said light emitting device, said encoder comprising:
    a driving unit having a first driving power output terminal, to which one of a pair of power supply terminals of said photo IC is connected, for outputting driving power to be used for intermittently driving said photo IC only for a desired time period.

2. The encoder according to claim 1, further comprising a capacitor connected between said pair of power supply terminals of said photo IC.

3. The encoder according to claim 1, wherein said light emitting device is connected to said first driving power output terminal.

4. The encoder according to claim 3, wherein said driving unit intermittently drives said light emitting device in synchronization with an operation of intermittently driving said photo IC, which is performed by said driving unit.

5. The encoder according to claim 1, wherein said light emitting device is connected to a second driving power output terminal from which driving power similar to that outputted from said first driving power output terminal is outputted.

6. The encoder according to claim 5, wherein said driving unit intermittently drives said light emitting device in synchronization with an operation of intermittently driving said photo IC, which is performed by said driving unit.

7. The encoder according to claim 1 wherein, in the desired time period, the encoder is in a low power consumption mode for reducing power consumption of said photo IC.

8. A coordinate input device comprising:
an encoder comprising a light emitting device and a photo IC for receiving light emitted from said light emitting device;
a driving unit comprising a first driving power output terminal, to which one of a pair of power supply terminals of said photo IC is connected, for outputting driving power to be used for intermittently driving said photo IC only for a desired time period; and
a slitted disk comprising a plurality of slits formed along a circumference of the disk at uniform intervals,
wherein coordinate input data, which is to be inputted to a computer, is generated according to slitted-disk rotation information.

9. The coordinate input device according to claim 8, further comprising a capacitor connected between said pair of power supply terminals of said photo IC.

10. The encoder according to claim 8, wherein said light emitting device is connected to said first driving power output terminal.

11. The encoder according to claim 10, wherein said driving unit intermittently drives said light emitting device in synchronization with an operation of intermittently driving said photo IC, which is performed by said driving unit.

12. The encoder according to claim 8, wherein said light emitting device is connected to a second driving power output terminal from which driving power similar to that outputted from said first driving power output terminal is outputted.

13. The encoder according to claim 12, wherein said driving unit intermittently drives said light emitting device in synchronization with an operation of intermittently driving said photo IC, which is performed by said driving unit.

14. The encoder according to claim 8, wherein the desired time period is in a low power consumption mode for reducing power consumption of said photo IC.

15. A control method of controlling an encoder having a light emitting device and a photo IC for receiving light from said light emitting device, wherein electric power for intermittently driving said photo IC for a desired time period is outputted from a first driving power output terminal to which one of a pair of power supply terminals of the photo IC is connected.

16. The method of controlling an encoder according to claim 15, wherein a capacitor is inserted between said pair of power supply terminals of said photo IC in parallel with said photo IC.

17. An apparatus, comprising:
a light emitting device emitting light;
a driving unit intermittently driving a photo IC which receives the light; and
a rotatable disk between the light emitting device and the photo IC, the disk comprising slits alternately blocking passage of the light,
wherein data regarding the received light is output from the photo IC and is used to determine coordinate information.

18. A method, comprising:
emitting light;
driving intermittently a photo IC which receives the light;
rotating a disk between the light emitting device and the photo IC, the disk comprising slits alternately blocking passage of the light; and
determining coordinate information based on data regarding the received light from the photo IC.

19. An apparatus, comprising:
light emitting means emitting light;
driving means intermittently driving a photo IC which receives the light; and
rotating disk means between the light emitting device and the photo IC,
wherein data regarding the received light is output from the photo IC and is used to determine coordinate information.

\* \* \* \* \*